US009170299B2

(12) United States Patent
Whetsel

(10) Patent No.: US 9,170,299 B2
(45) Date of Patent: Oct. 27, 2015

(54) DDR ADDRESSABLE TAP INTERFACE WITH SHADOW PROTOCOL AND TAP DOMAIN

(71) Applicant: Texas Instruments Incorporated, Dallas, TX (US)

(72) Inventor: Lee D. Whetsel, Parker, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/508,526

(22) Filed: Oct. 7, 2014

(65) Prior Publication Data
US 2015/0058689 A1   Feb. 26, 2015

Related U.S. Application Data

(62) Division of application No. 13/887,862, filed on May 6, 2013, now Pat. No. 8,898,528, which is a division of application No. 13/671,751, filed on Nov. 8, 2012, now Pat. No. 8,473,794, which is a division of application No. 13/241,503, filed on Sep. 23, 2011, now abandoned, which is a division of application No. 12/957,904, filed on Dec. 1, 2010, now Pat. No. 8,051,351, which is a division of application No. 12/758,143, filed on Apr. 12, 2010, now Pat. No. 7,870,450, which is a division of application No. 11/874,714, filed on Oct. 18, 2007, now Pat. No. 7,725,791.

(60) Provisional application No. 60/862,298, filed on Oct. 20, 2006.

(51) Int. Cl.
G01R 31/3177 (2006.01)
G01R 31/3185 (2006.01)
G01R 31/28 (2006.01)
G11C 29/48 (2006.01)

(52) U.S. Cl.
CPC ........ G01R 31/3177 (2013.01); G01R 31/2851 (2013.01); G01R 31/318544 (2013.01); G01R 31/318547 (2013.01); G11C 29/48 (2013.01)

(58) Field of Classification Search
CPC ............. G01R 31/3177; G01R 31/31721; G01R 31/318575; G01R 31/318577; G01R 31/318544; G01R 31/318536; G01R 31/318555; G01R 31/318558; G01R 31/2851; G01R 31/28; G11C 29/48
USPC ................................................ 714/727, 729
See application file for complete search history.

(56) References Cited

U.S. PATENT DOCUMENTS

| | | | | |
|---|---|---|---|---|
| 7,096,393 B2* | 8/2006 | Caty et al. | | 714/718 |
| 7,116,135 B2* | 10/2006 | Wang et al. | | 327/108 |
| 7,165,199 B2* | 1/2007 | Warren | | 714/724 |
| 7,657,807 B1* | 2/2010 | Watkins et al. | | 714/727 |
| 7,870,450 B2* | 1/2011 | Whetsel | | 714/727 |

OTHER PUBLICATIONS

Kim, H.C.; Jun, H.-S.; Xinli Gu; Chung, S.S.;, "At-speed interconnect test and diagnosis of external memories on a system," Test Conference, 2004. Proceedings. ITC 2004. International, vol., No., pp. 156-162, Oct. 26-28, 2004.*

*Primary Examiner* — Cynthia Britt

(74) *Attorney, Agent, or Firm* — Lawrence J. Bassuk; Charles A. Brill; Frank D. Cimino

(57) ABSTRACT

A process and apparatus provide a JTAG TAP controller (302) to access a JTAG TAP domain (106) of a device using a reduced pin count, high speed DDR interface (202). The access is accomplished by combining the separate TDI and TMS signals from the TAP controller into a single signal and communicating the TDI and TMS signals of the single signal on the rising and falling edges of the TCK driving the DDR interface. The TAP domain may be coupled to the TAP controller in a point to point fashion or in an addressable bus fashion. The access to the TAP domain may be used for JTAG based device testing, debugging, programming, or other type of JTAG based operation.

3 Claims, 25 Drawing Sheets

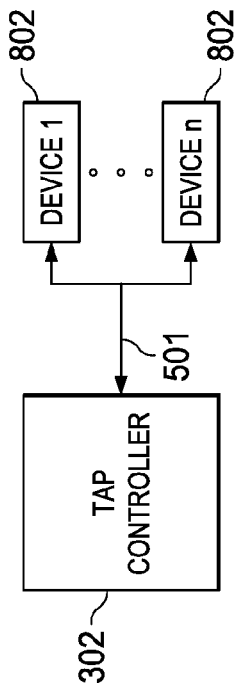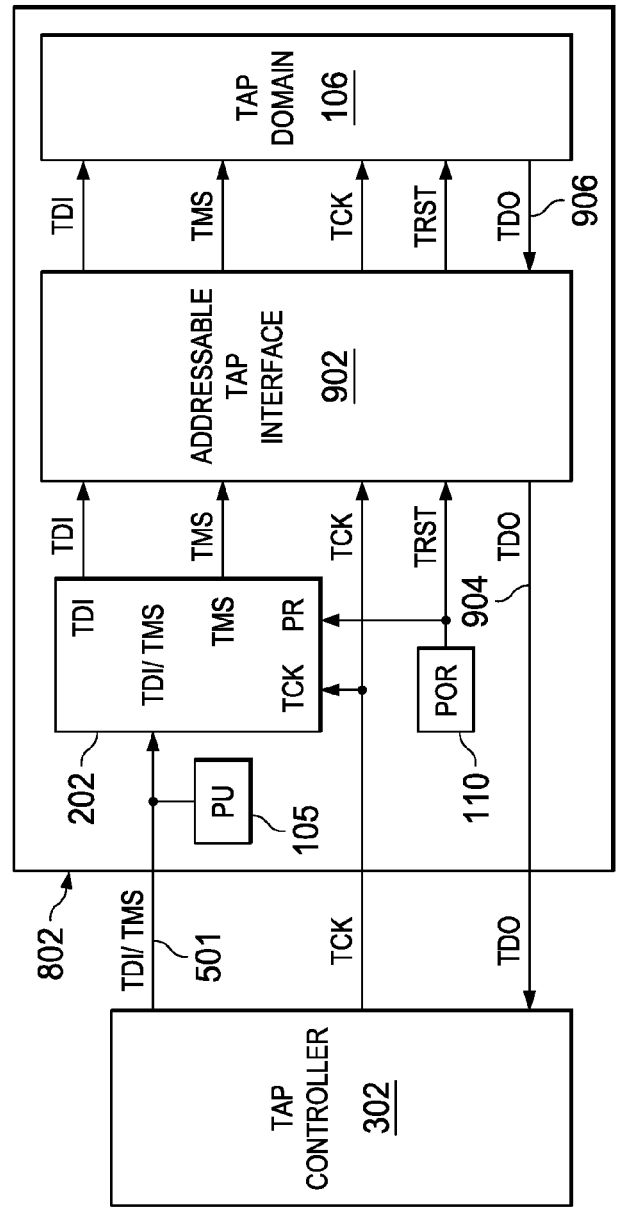

ered by the controller 104. Pulling TMS high causes the TAP state machine of the TAP domain 106 to remain in the Test Logic Reset state of FIG. 12A. If the optional TRST signal is not used, a power up reset (POR) circuit 110 may be used in the device 108 to reset the TAP domain when the device powers up. The device's TAP domain 106 can also be reset by an input sequence from the TAP controller 104 on bus 102.

DDR ADDRESSABLE TAP INTERFACE WITH SHADOW PROTOCOL AND TAP DOMAIN

CROSS REFERENCE TO RELATED PATENTS

This application is a divisional of application Ser. No. 13/887,862, filed May 6, 2013, now U.S. Pat. No. 8,898,528, issued Nov. 25, 2014;

Which was a divisional of application Ser. No. 13/671,751, filed Nov. 8, 2012, now U.S. Pat. No. 8,473,794, granted Jun. 25, 2013;

Which was a divisional of application Ser. No. 13/241,503, filed Sep. 23, 2011, now abandoned;

Which was a divisional of application Ser. No. 12/957,904, filed Dec. 1, 2010, now U.S. Pat. No. 8,051,351, granted Nov. 1, 2011;

Which was a divisional of application Ser. No. 12/758,143, filed Apr. 12, 2010, now U.S. Pat. No. 7,870,450, granted Jan. 11, 2011;

Which was a divisional of application Ser. No. 11/874,714, filed Oct. 18, 2007, now U.S. Pat. No. 7,725,791, granted May 5, 2010;

and claims priority from Provisional Application 60/862,298, filed Oct. 20, 2006.

FIELD OF THE DISCLOSURE

This disclosure relates to a JTAG interface that uses double data rate circuitry for accessing devices on a substrate using a reduced number of device pins.

BACKGROUND OF THE DISCLOSURE

Electrical devices, which may be boards, ICs or embedded cores within ICs, use JTAG interfaces to provide for testing and debugging of the device's hardware and software designs. In the past, device test and debug interfaces used the full pin JTAG interface consisting of a TDI, TCK, TMS, TDO, and an optional TRST pin. More recently, reduced pin JTAG interfaces are being developed and used for test and debug when device pins are not available for the full pin JTAG interface. Some known reduced pin JTAG interfaces include; (1) a simultaneously bidirectional transceiver (SBT) based reduced pin JTAG interface described in a 2006 International Test Conference paper by Whetsel which is incorporated by reference herein, (2) an IEEE standard P1149.7 described in a white paper which is incorporated by reference herein, (3) a JTAG Link (JLINK) interface developed by DebugInnovations which is incorporated by reference herein, and (4) a single wire JTAG (SWJ) interface developed by ARM Ltd which is incorporated by reference herein. Reducing the number of JTAG pins, while enabling access to pin limited device, brings about a reduction in the communication bandwidth between a JTAG controller and JTAG device. The disclosure describes a JTAG interface based on double data rate circuitry that reduces JTAG pins while advantageously maintaining a high communication bandwidth between a JTAG controller and JTAG device. The double data rate JTAG interface may be used for device test, debug, programming or other operations performed today by the JTAG bus.

FIG. 1 illustrates an example of a full pin JTAG interface bus 102 coupled between a JTAG TAP controller 104 and JTAG TAP domain 106 within a device 108. The TAP domain is an IEEE 1149.1 based architecture that includes a TAP state machine, an instruction register, and plural data registers. The TAP domain 106 may be used for testing, debugging, or programming of the device 108. The full pin JTAG (IEEE 1149.1) interface 102 comprises a TDI, TCK, TMS, TDO and optionally a TRST signal. Pull up (PU) elements 105 are required on the TDI and TMS inputs of the device 108 to pull these signals high if they are not externally driv Timing diagram 110 illustrates the operation of JTAG bus 102 during a scan operation. As seen, the TAP controller 104 outputs TDI and TMS signals to the TAP domain 106 on the falling edge 114 of the TCK and the TAP domain samples the TDI and TMS signals on the rising edge of the TCK 116. The TAP domain 106 outputs the TDO signal to the TAP controller 104 on the falling edge 114 of the TCK and the TAP controller samples the TDO signal on the rising edge 116 of the TCK. The timing operation of the JTAG bus 102 between the TAP controller 104 and TAP domain 106 1 is well known and broadly used in the industry for serially accessing devices for test, debug, programming and/or other operations.

FIG. 2 illustrates an example of a double data rate (DDR) circuit 202 interfaced between a sending circuit 204 and a receiving circuit 206. The DDR circuit 202 comprises flip flops 208-214 arranged as shown. The sending circuit 204 outputs an A/B data signal and a clock signal to the DDR circuit 202. The clock signal output from the sending circuit 204 is also input to the receiving circuit 206. The data inputs of Flip flops 208 and 210 are coupled to the A/B data output signal from sending circuit 204 and their clock inputs are coupled to the clock output signal from sending circuit 204. The data input of flip flop 212 is coupled to the data output of flip flop 208 and the data input of flip flop 214 is coupled to the data output of flip flop 210. The clock inputs of flip flops 212 and 214 are coupled to the sending circuit's clock output signal.

As seen in timing diagram 216, the sending circuit outputs serial A 218 and B 220 data components on the A/B signal to the DDR circuit 202 during each clock output signal 228-236. Flip flop 208 stores the A data component 218 during the rising edge 224 of the clock signal 222 and flip flop 210 stores the B data component 220 on the falling edge 226 of the clock signal 222. The A data component 218 and B data component 220 stored into flip flops 208 and 210 are transferred into flip flops 212 and 214, respectively, on the rising edge 224 of the next clock period 230. The A and B data components stored into flip flops 212 and 214 are transferred into the receiving circuit 206 on the rising edge 224 of the next clock signal 232. This process of serially inputting A and B data components from the A/B signal output from the sending circuit 204 followed by outputting the A and B data components in parallel to the receiving circuit 206 is repeated during the operation of the DDR circuit. DDR circuits are high speed circuits and can transfer data well above 100 MHz.

As will be described below, the disclosure takes advantage of the high speed DDR circuit's ability to serially input two data components, A 218 and B 220, from a single output of a sending circuit during the rising 224 and falling 226 edges of a first clock signal 228 respectively, separate and output the A and B components during the rising edge 224 a second clock signal 230, and input the separated A and B components in parallel to a receiving circuit on the rising edge 224 of a third clock signal 232.

BRIEF SUMMARY OF THE DISCLOSURE

The disclosure provides a high speed, reduced pin count JTAG device interface utilizing double data rate circuitry. The interface of the disclosure also provides for device addressing and TAP domain selection within an addressed device.

BRIEF DESCRIPTION OF THE VIEWS OF THE DRAWINGS

FIG. 7 illustrates a TAP controller interfaced to plural devices via separate busses according to the disclosure.

FIG. 8 illustrates a TAP controller interfaced to plural devices via a common bus according to the disclosure.

FIG. 9 illustrates the JTAG DDR interface to a device that includes device addressing circuitry according to the disclosure.

DETAIL DESCRIPTION OF THE DISCLOSURE

Figure 1:
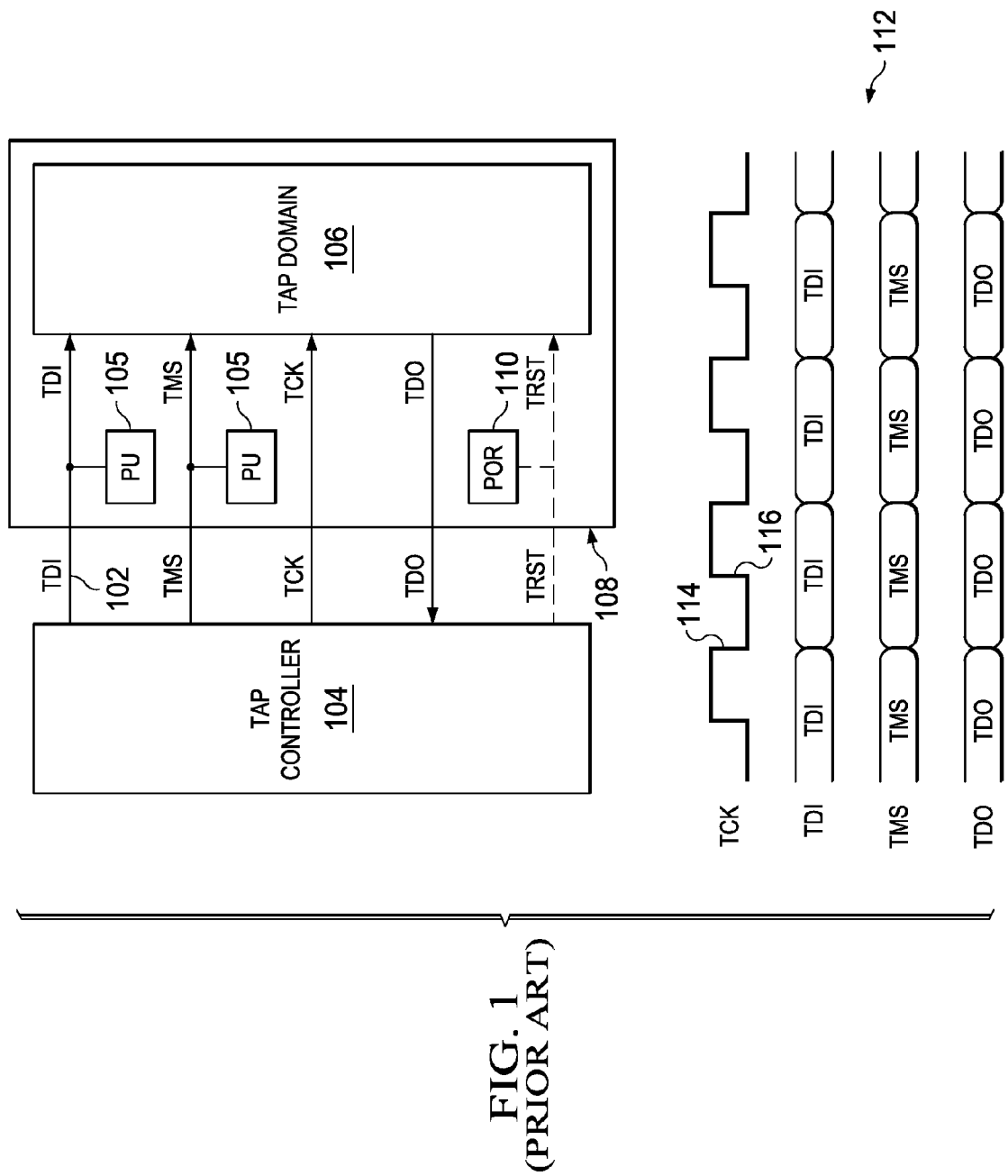
FIG. 1 illustrates an interface between a JTAG TAP controller and a TAP domain within a device.
Figure 2:
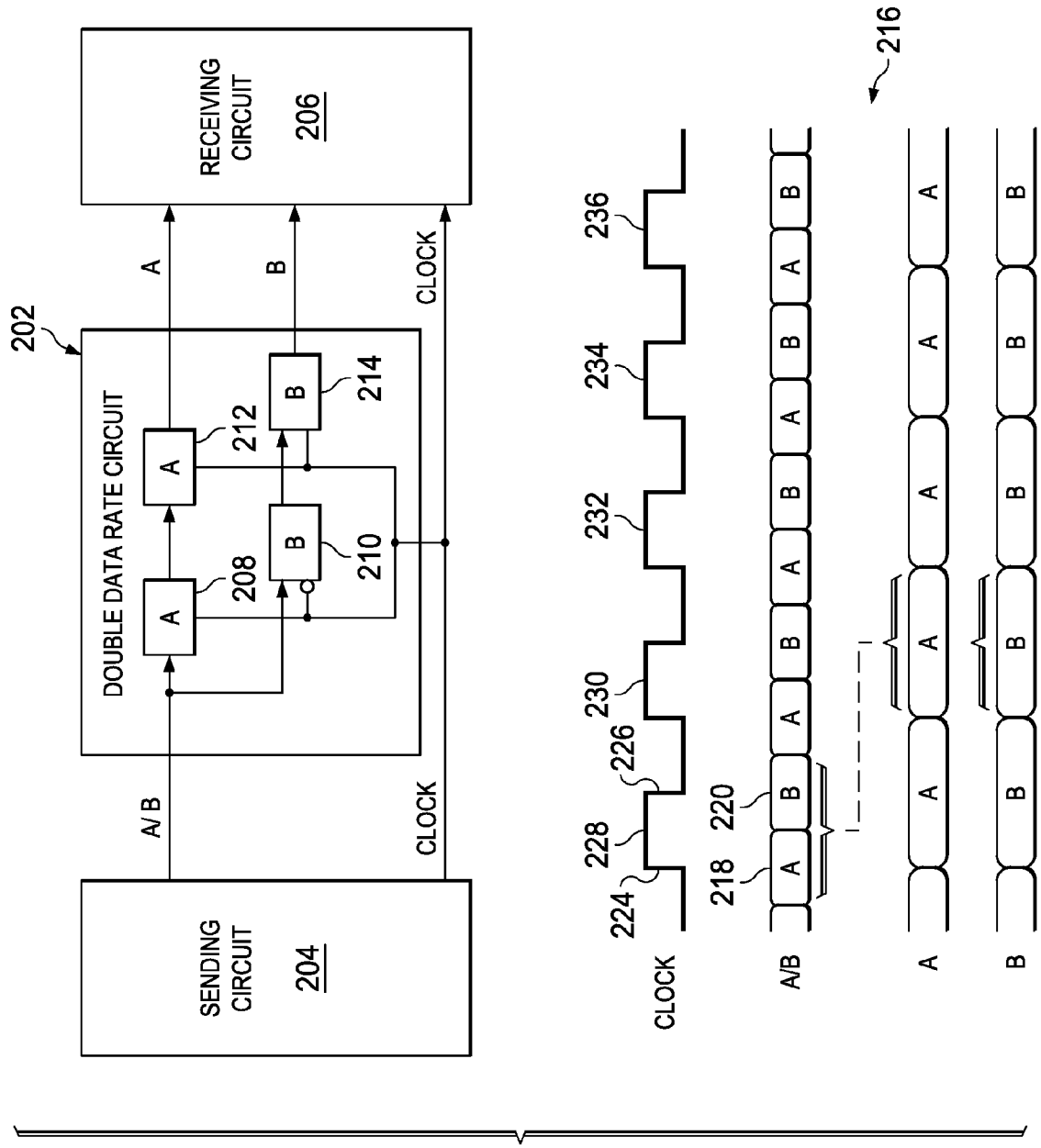
FIG. 2 illustrates a double data rate (DDR) circuit for communicating data between a sending and receiving circuit.
Figure 3:
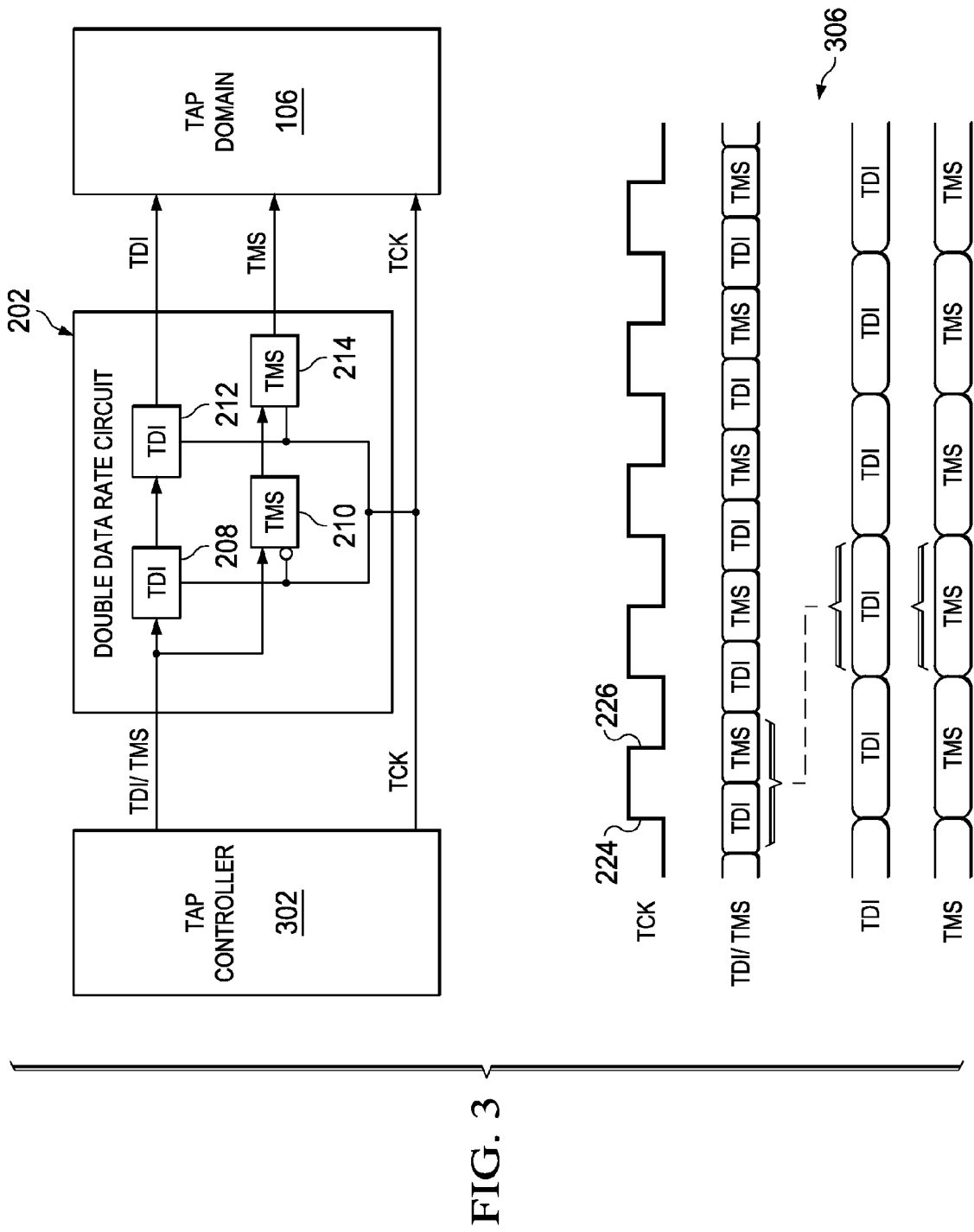
FIG. 3 illustrates a DDR circuit for communicating TDI and TMS signals from a TAP controller to a TAP domain according to the disclosure.

FIG. 3 illustrates the DDR circuit 202 of FIG. 2 being used to provide a high speed, reduced pin JTAG interface between a TAP controller 302 and a TAP domain 106 within a device, according to the disclosure. The reduced pin interface is achieved by combining the separate TDI and TMS signals of the TAP controller 104 of FIG. 1 into serialized signal components that are output from the TAP controller 302 to DDR circuit 202 via the single TDI/TMS signal from TAP controller 302. As seen in the timing diagram, the operation of the DDR circuit is the same as described in FIG. 2. The only differences are that the A component of the A/B signal from the sending circuit 204 is now the TDI component of the TDI/TMS signal from the TAP controller 302, the B component of the A/B signal from the sending circuit 204 is now the TMS component of the TDI/TMS signal from the TAP controller 302, and the clock signal from sending circuit 204 is now the TCK signal from the TAP controller 302. Rising TCK edges 224 clock in the TDI component of TDI/TMS to DDR circuit 202 and falling TCK edges 226 clock in the TMS component of TDI/TMS to DDR circuit 202.

Figure 3A:
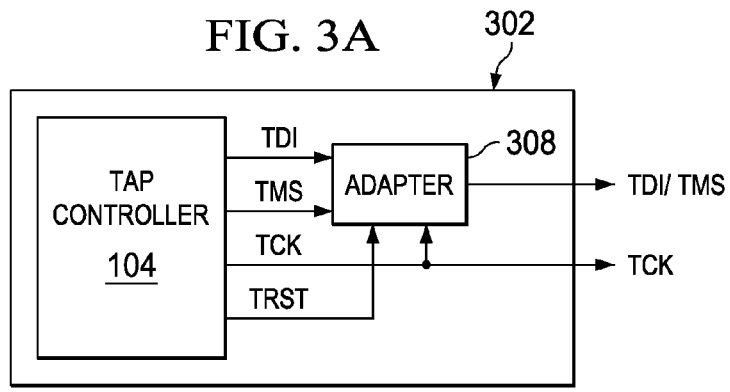
FIG. 3A illustrates an example of a TAP controller interfaced to an adapter for communicating TDI and TMS signals to a TAP domain via the DDR circuit of FIG. 3 according to the disclosure.

FIG. 3A illustrates an example implementation of the TAP controller 302 of FIG. 3, which comprises the TAP controller 104 of FIG. 1 and an adapter circuit 308. The adapter circuit 308 serves to convert the separate TDI and TMS signal outputs from TAP controller 104 into the single TDI/TMS signal output of FIG. 3. The single TDI/TMS signal output serially transmits the TDI and TMS signal components to the DDR circuit 202 of FIG. 3.

Figure 3B:
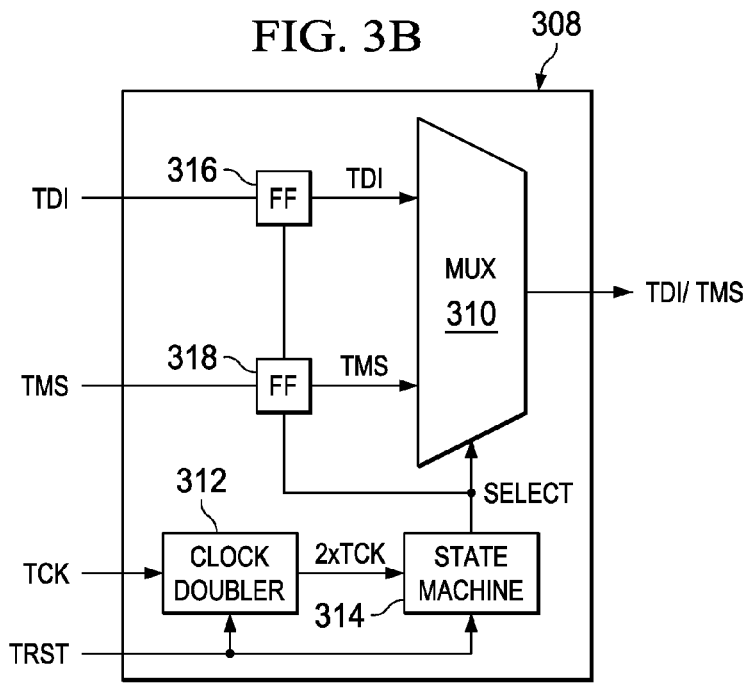
FIG. 3B illustrates an example implementation of the adapter of FIG. 3A.

FIG. 3B illustrates an example implementation of the adapter circuit 308, which comprises a multiplexer 310, a TCK clock doubler 312, a state machine 314, and flip flops 316 and 318 connected as shown. The clock doubler 312 inputs the TCK and outputs a doubled TCK signal (2×TCK) to the state machine 314. The state machine inputs the 2×TCK signal and outputs a select signal to multiplexer 310 and flip flops 316 and 318. The rising edge of the select signal latches the TDI and TMS signals from TAP controller 104 to multiplexer 310, via flip flops 316 and 318, to keep them stable during the serialization process. The select signal controls the multiplexer 310 to alternately output the latched TDI and TMS signals onto the TDI/TMS signal to DDR circuit 202. The clock doubler 312 and state machine 314 are initialized in response to a low on the TRST signal output from TAP controller 104.

Figure 3C:
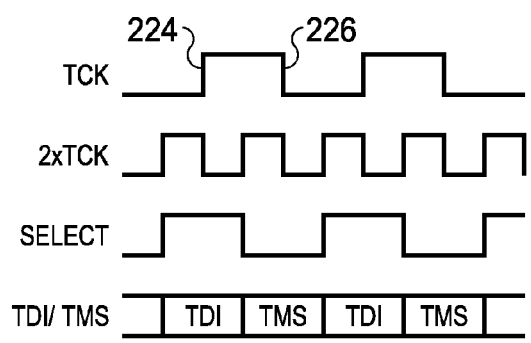
FIG. 3C illustrates a timing diagram of the operation of the adapter circuit of FIG. 3B.

FIG. 3C illustrates the timing diagram of the operation of adapter 308. As seen, the select signal is controlled by the state machine to cause the multiplexer 310 to output the latched TDI output from TAP controller 104 on TDI/TMS so that it is clocked into the DDR circuit 202 on the rising edge 224 of the TCK signal which meets the rising edge TDI timing shown in timing diagram 306. Further, the select signal is controlled by the state machine to cause the multiplexer 310 to output the latched TMS output from the TAP controller 104 on TDI/TMS so that it is clocked into the DDR circuit 202 on the falling edge 226 of the TCK signal which meets the falling edge TMS timing shown in timing diagram 306. This process of controlling the select signal to alternately output TDI and TMS onto TDI/TMS continues.

While the circuit and timing examples shown and described in regard to FIGS. 3, 3A, 3B, and 3C use timing where the TDI component is input to the DDR circuit 202 on the rising edge of TCK and the TMS component is input to the DDR circuit 202 on the falling edge of TCK, this need not be the case. It should be understood that TMS could be input to the DDR circuit on the rising edge and TDI could be input to the DDR circuit on the falling edger if so desired.

In comparing the timing diagram 112 of FIG. 1 with the timing diagram 306 of FIG. 3 it is seen that the TDI and TMS inputs to the TAP domain 106 in FIG. 3 are output from the DDR circuit 202 on the rising edge of TCK. While this TDI and TMS input timing will operate the TAP domain 106 correctly, it does not meet the falling edge TCK timing shown in FIG. 1, which is the suggested TDI and TMS setup timing described in the JTAG IEEE 1149.1 standard. To exactly meet the falling edge TCK setup timing for the TDI and TMS inputs to the TAP domain 106, the DDR circuit can be modified as described below in regard to the FIG. 4.

Figure 4:
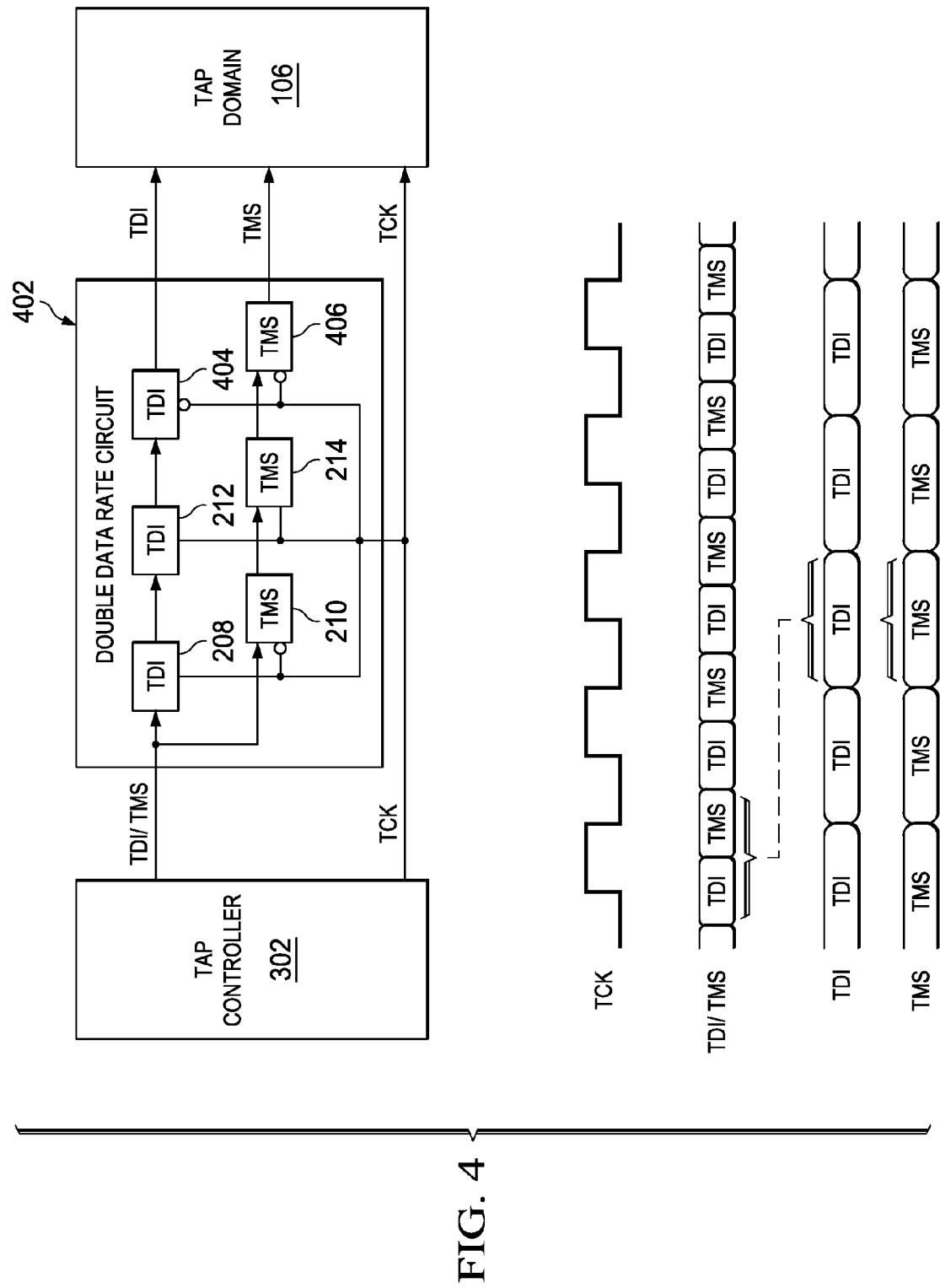
FIG. 4 illustrates the DDR circuit of FIG. 3 adapted to meet JTAG signal timing suggested in IEEE standard 1149.1.

FIG. 4 illustrates a DDR circuit 402 modified to meet the falling edge TCK setup timing for the TDI and TMS inputs to TAP domain 106. DDR circuit 402 is the same as the DDR circuit 202 of FIG. 3 with the exception that an additional pair of falling edge flip flops 404 and 406 are added between flip flops 212 and 214 and the TAP domain 106 to cause the TDI and TMS signal inputs to the TAP domain 106 to occur on the falling edge of TCK. With this modification, the DDR circuit 402 exactly meets the falling edge TCK input of the TDI and TMS signals to the TAP domain 106.

Figure 5:
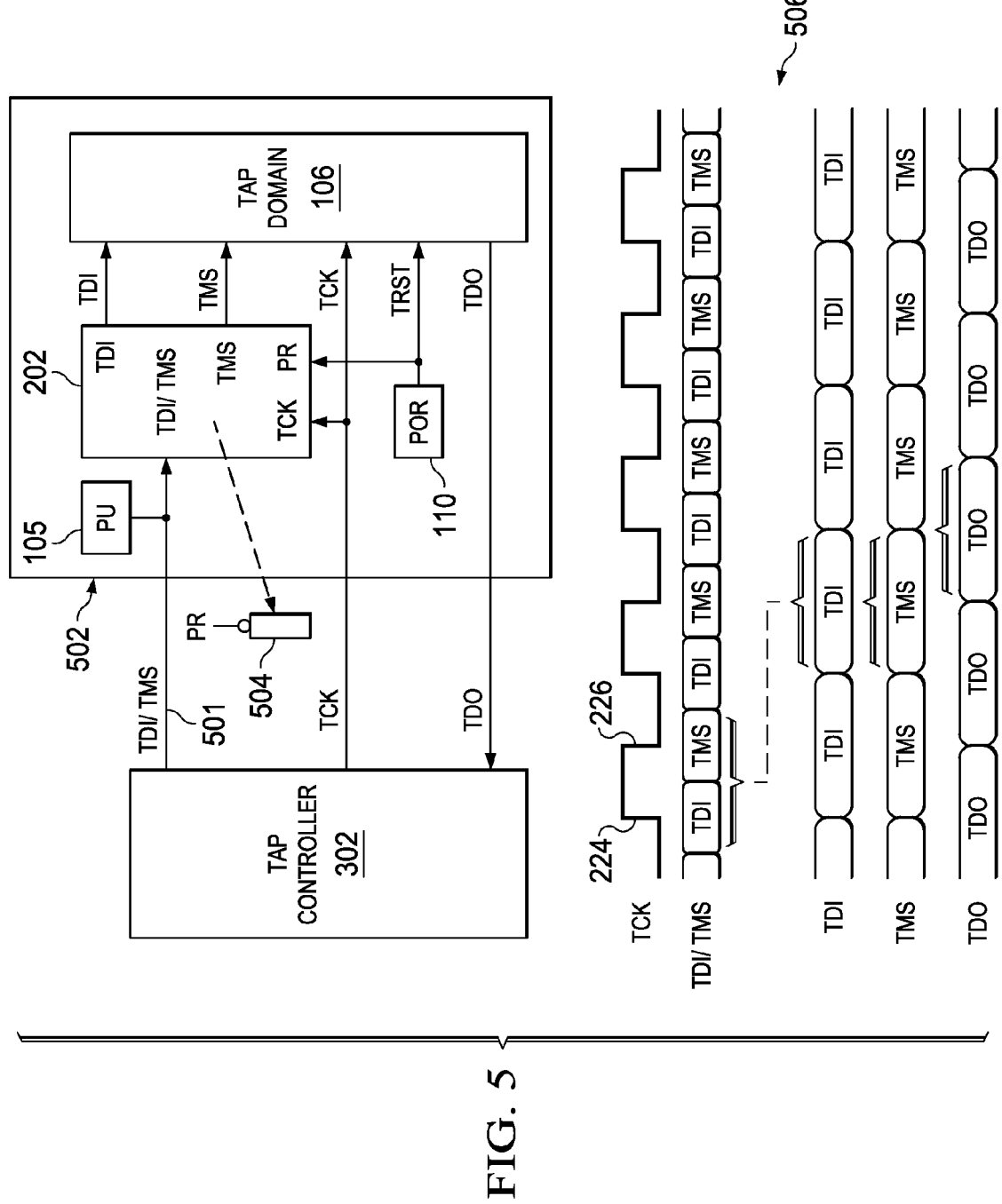
FIG. 5 illustrates a first example JTAG DDR interface between a TAP controller and TAP domain according to the disclosure.

FIG. 5 illustrates a complete high speed, reduced pin DDR interface 501 between TAP controller 302 and TAP domain 106 of a device 502, which consists of a TDI/TMS signal, a TCK signal, and a TDO signal. The TRST signal to the TAP domain 106 is provided by a POR circuit 110 in the device to eliminate the need for the TRST signal in the interface. The TRST output of the POR circuit 110 is also input to the DDR circuit 202 as a preset input (PR) to set the DDR flip flops 208-214 high at power up. Each DDR flip flop 208-214 will be modified to include a PR input that is coupled to the TRST signal, via the DDR PR input, as shown in example flip flop 504. Presetting the flip flops high at power up causes the TDI and TMS inputs to the TAP domain 106 to be set high. Setting TMS high holds the TAP state machine of the TAP domain 106 in the Test Logic Reset state shown in FIG. 12A. The PU element 105 is used to maintain the TDI/TMS input to DDR circuit 202 high when the TDI/TMS input is not externally driven. With the TDI/TMS input held high, the DDR circuit 202 will continue to output highs on TDI and TMS to the TAP domain 106 if the TCK is active, which will maintain the TAP state machine of the TAP domain 106 in the Test Logic Reset state.

The operation of the complete reduced pin DDR interface 501 of FIG. 5 is illustrated in timing diagram 506. The TDI component of the TDI/TMS signal is clocked into the DDR circuit 202 on the rising edges 224 of TCK and the TMS component of the TDI/TMS signal is clocked into the DDR circuit 202 on the falling edges 226 of TCK. The TDO output from TAP domain 106 is output from the TAP domain 106 on the falling edges 226 of TCK and sampled into the TAP controller 302 on the rising edges 224 of the TCK. As previously mentioned in regard to FIG. 3, and as shown in timing diagram 506, the DDR circuit 202 outputs TDI and TMS to the TAP controller on the rising edge of TCK. As mentioned, rising edge input of TDI and TMS signals from the DDR circuit 202 to TAP domain 106 works but it does not meet the suggested falling TCK edge TDI and TMS input timing stated in the IEEE 1149.1 standard.

It should be noted that inputting TDI and TMS to the TAP domain 106 on the rising edge of the TCK does have an advantage in that it provides a greater setup time for the TDI and TMS inputs with respect to the rising edge of the TCK. Thus a higher TCK frequency may be used if TDI and TMS are input to the TAP domain 106 on the rising edge of TCK as shown in timing diagram 506. However, since the TDO output from the TAP domain 106 operates on the falling edge of TCK it limits any potential increase in frequency provided by having rising edge TDI and TMS input to the TAP domain 106. One way of improving the operating frequency of the interface 501 is to modify the TAP domain to where it outputs TDO on the rising edge of TCK.

Figure 5A:
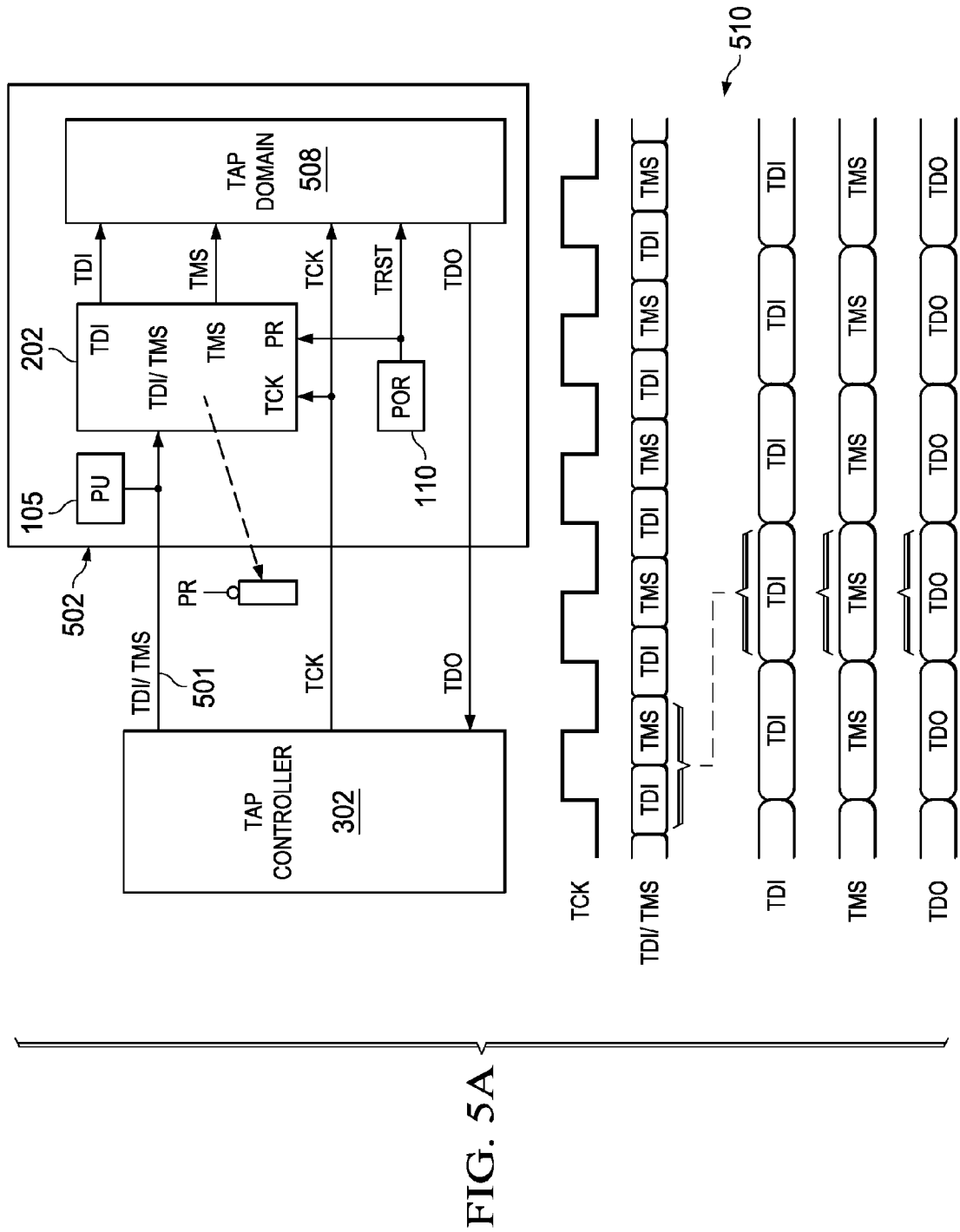
FIG. 5A illustrates a second example JTAG DDR interface between a TAP controller and TAP domain according to the disclosure.

FIG. 5A illustrates the reduced DDR interface arrangement of FIG. 5 which includes a TAP domain 508 that has been modified to output TDO on the rising edge of TCK. As seen in timing diagram 510, since TDO is output to the TAP controller 302 on the rising edge of TCK, which provides a greater TDO setup time to the TAP controller 302 with respect to the rising edge of TCK, the interface 501 can operate at higher TCK frequencies.

Figure 6:
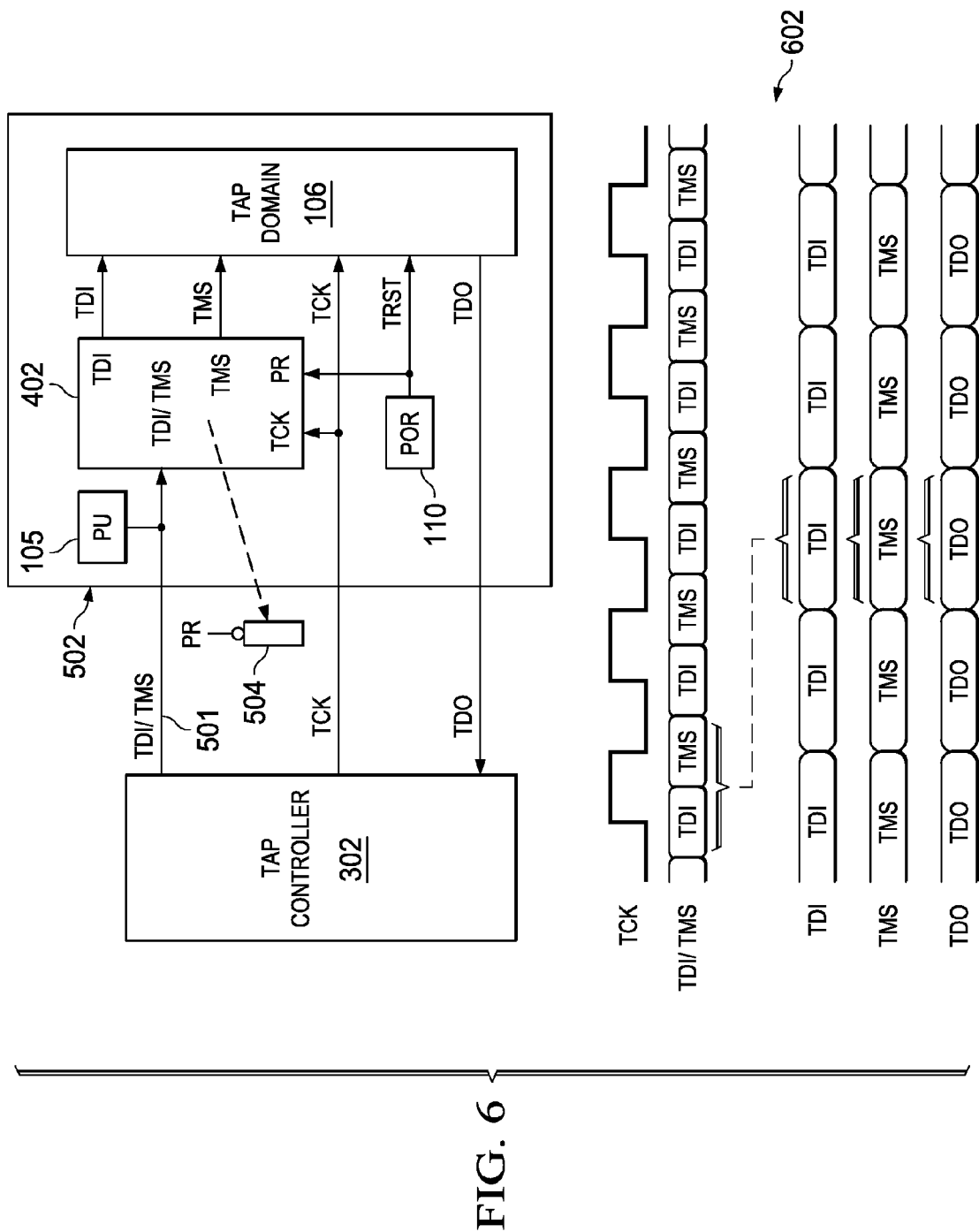
FIG. 6 illustrates a third example JTAG DDR interface between a TAP controller and TAP domain according to the disclosure.

FIG. 6 illustrates the complete reduced pin DDR interface 501 between TAP controller 302 and TAP domain 106 of device 502 of FIG. 5 modified to use the DDR circuit 402 of FIG. 4 instead of DDR circuit 202 of FIG. 3. The interface of FIG. 6 operates exactly as the interface of FIG. 5 with the exception that DDR circuit 402 has been substituted for DDR circuit 202. Also the flip flops 208-214 and 404-406 of DDR circuit 402 have been modified to include the preset inputs (PR) mentioned in regard to FIG. 5 to provide for them to be preset high in response to a TRST input from POR circuit 110 for the reasons mentioned in FIG. 5. The reason to use DDR circuit 402 in place of DDR circuit 202 is to make the TDI and TMS input timing to TAP domain 106 match the falling edge TCK timing suggested in the IEEE 1149.1 standard. As seen in operation timing diagram 602, the DDR circuit 402 inputs the TDI and TMS signals to the TAP domain on the falling edge of TCK as opposed to inputting them on the rising edge as seen in the timing diagram 505 of FIG. 5.

Since the reduced pin JTAG interfaces of FIGS. 5, 5A, and 6 use high speed DDR interfaces for inputting TDI and TMS from a single TDI/TMS signal, the performance of the reduced pin JTAG interfaces can match that of the full pin JTAG interface of FIG. 1. For example, if the full pin JTAG interface of FIG. 1 can operate at a TCK rate of 50 Mhz, the reduce pin JTAG interfaces of FIGS. 5, 5A, and 6 can also operate at 50 Mhz. With a 50 Mhz operation of the reduced pin JTAG interfaces, the TDI and TMS signal components are transmitted at 100 Mhz using the rising and falling edges of the 50 Mhz TCK, which is a reasonable transmission rate for signals transmitted using DDR interfaces. Thus using DDR circuitry, the reduced pin JTAG interface of the disclosure does not degrade the performance of JTAG interfaces, as do the reduced pin interfaces mentioned in the background section of this description.

FIG. 7 illustrates an example of a TAP controller 702 interfaced to a plurality of devices 502 via point to point reduced pin DDR interfaces 501. The devices 502 could be the device of FIG. 5, the device of FIG. 5A, or the device of FIG. 6. To access the devices 502, the TAP controller 702 requires a TAP controller 302 for each device 502 interface 501. While the point to point device access arrangement of FIG. 7 is useful in many types test, debug, and programming access applications, it would be advantageous if each device 502 could also be selectively accessed by a single interface 501 to a TAP controller 302 as shown in FIG. 8.

FIG. 8 illustrates an arrangement where a plurality of devices 802 are coupled to a single TAP controller 302 via a single interface bus 501. The devices 802 are similar to device 502 with the exception that they have been modified to provide for interface bus 501 to selectively access the devices individually. The bussed arrangement of FIG. 8 is useful for device test, debug, and/or programming operations when the devices 802 are embedded on a substrate that can only support one interface 501. The following description describes how the reduce pin DDR interface and circuitry is modified to provide for the bussed access arrangement to devices 802 of FIG. 8.

FIG. 9 illustrates the reduced pin DDR interface 501 between TAP controller 302 and TAP domain 106 of a device 802. The reduced pin DDR interface circuitry of device 802 is the same as device 502 of FIGS. 5, 5a, and 6 with the exception that device 802 includes an addressable TAP interface circuit 902 located between the DDR circuit 202 and TAP domain 106. While DDR circuit 202 is shown being used in FIG. 9, DDR circuit 402 could be used as well. Also while TAP domain 106 is shown being used in FIG. 9, TAP domain circuit 508 could be used as well. The addressable TAP interface 902 has a first bus 904 coupled to the TDO signal to TAP controller 302, the TRST signal from POR 110, the TCK signal from TAP controller 302, and the TMS and TDI signals from DDR circuit 202. The addressable TAP interface 902 has a second bus 906 coupled to the TDO signal from TAP domain 106 and the TRST, TCK, TMS, and TDI signals to TAP domain 106. The addressable TAP interface 902 operates to selectively couple or de-couple busses 904 and 906.

Figure 10:
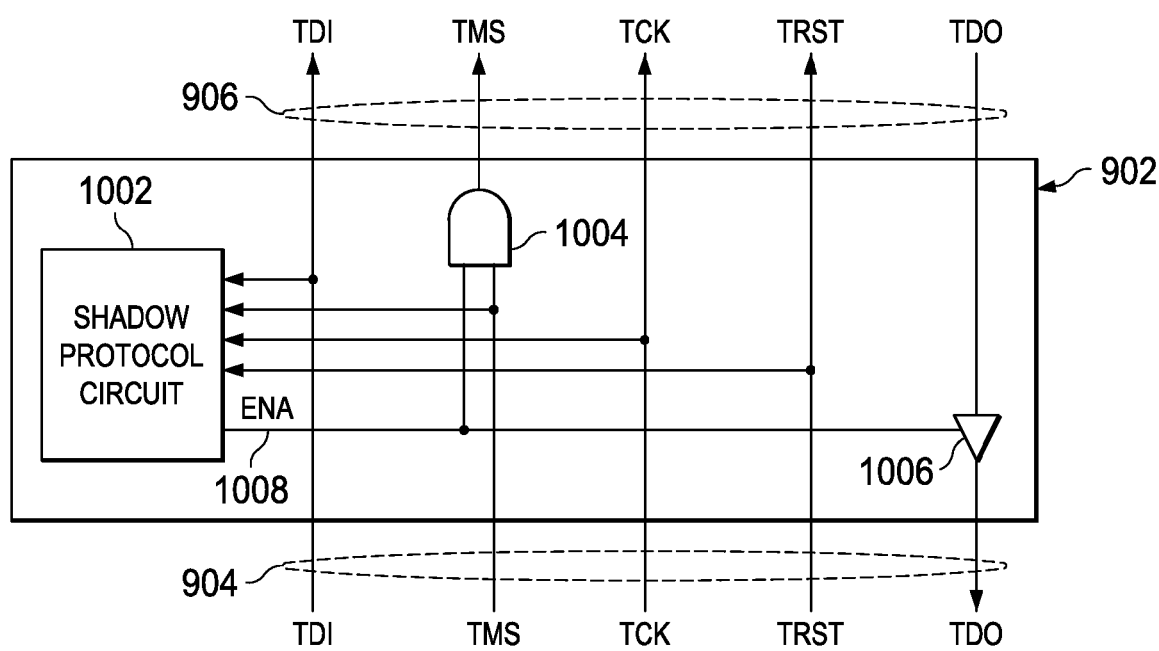
FIG. 10 illustrates an example implementation of the addressing circuit of FIG. 9.

FIG. 10 illustrates the addressable TAP interface 902 of FIG. 9 in more detail, which comprises a shadow protocol circuit 1002, And gate 1004, and TDO 3-state buffer 1006. Addressable TAP interface circuit 902 inputs the TDI, TCK, TMS and TRST signals from bus 904, outputs a TDO signal to bus 904, and outputs an enable (ENA) signal 1008 to And gate 1004 and TDO 3-state buffer 1006. The ENA signal 1008 enables And gate 1004 and 3-state buffer 1006, to provide for bus 904 to be fully coupled to bus 906. When bus 906 is fully coupled to bus 904, the TAP domain 106 of FIG. 9 may be accessed by the TAP controller 302 via the reduce pin DDR interface 501.

Figure 11:
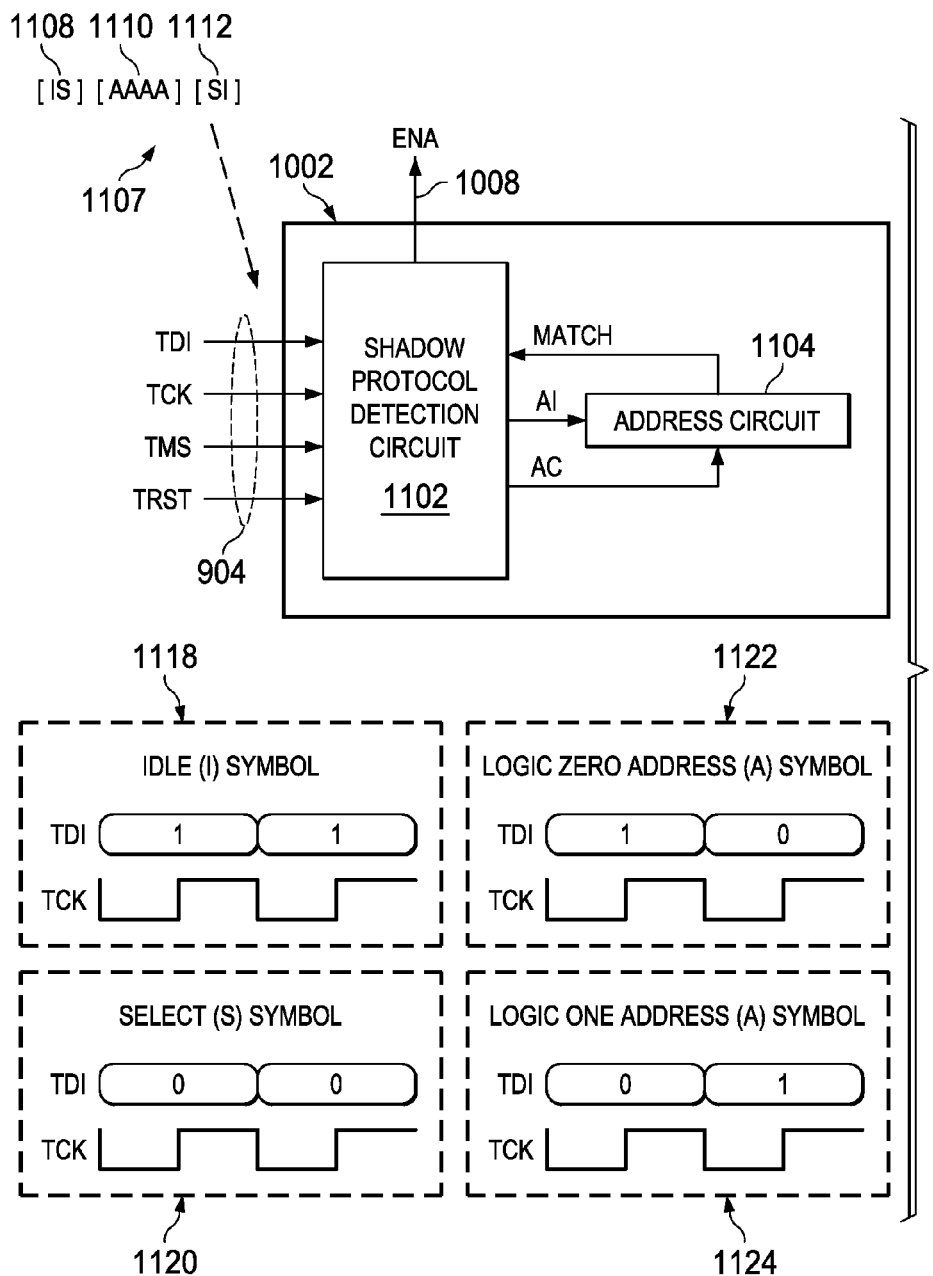
FIG. 11 illustrates an example implementation of the controller of the addressing circuit of FIG. 10.

FIG. 11 illustrates the shadow protocol circuit 1002 in more detail, which comprises a shadow protocol detection circuit 1102 and an address circuit 1104. The shadow protocol detection circuit 1102 inputs the TDI, TCK, TMS and TRST signals from bus 904 and a match signal from address circuit 1104. The detection circuit 1102 outputs an address input (AI) signal and address control (AC) signals to address circuit 1104 and the ENA signal 1008 to And gate 1004 and 3-state buffer 1006 of FIG. 10.

Figure 12A:
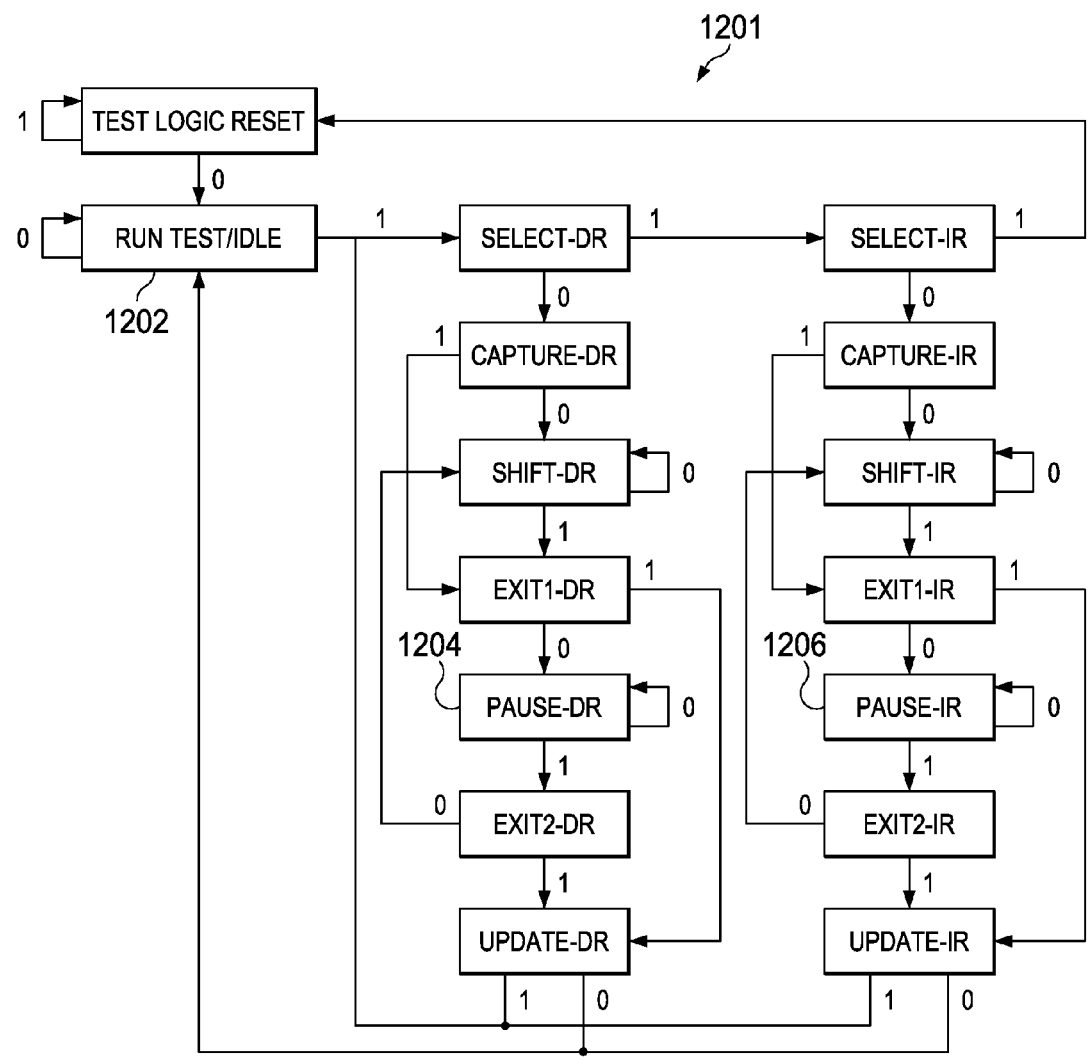
FIG. 12A illustrates the IEEE 1149.1 TAP state diagram.

When the JTAG bus 904 is in the RunTest/Idle state 1202, the Pause-DR state 1204, or the Pause-IR state 1206 of the IEEE 1149.1 TAP state diagram 1201 of FIG. 12A, the Detection circuit 1102 is enabled to respond to a shadow protocol message 1107 input on TDI to input address data to the address circuit 1104. If the JTAG bus 904 is not in one of these states 1202-1206, the detection circuit 1102 is disabled from responding to the message 1107. The detection circuit 1102 is reset by the TRST signal going low or by the JTAG bus 904 transitioning to the Test Logic Reset state of FIG. 12A.

The shadow protocol message 1107 consists of a start field 1108 comprising an idle symbol (I) 1118 and a select symbol (S) 1120, an address field 1110 comprising a number of logic one or zero address symbols (A) 722 and 724, and a stop field 1112 comprising a select symbol (C) 1120 and an idle symbol (I) 1118. The symbols 1118-1124 are each defined by a pair of logic bits, with the I symbol 1118 being two logic ones, the S symbol 1120 being two logic zeros, the logic zero A symbol 1122 being a logic one followed by a logic zero, and the logic one A symbol 1124 being a logic zero followed by a logic one. As seen, the TCK times the symbol bit pair inputs on TDI. If desired the symbol bit pair definitions may be defined differently from that shown in examples 1118-1124.

Figure 12B:
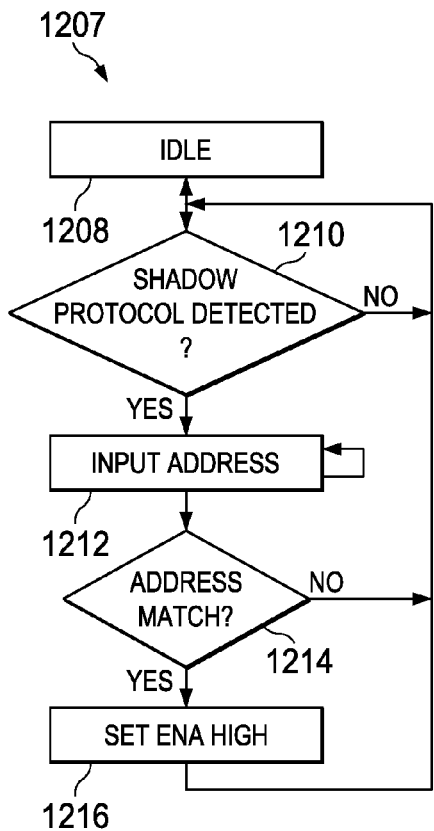
FIG. 12B illustrates the state diagram of the controller of FIG. 11.

FIG. 12B illustrates the state diagram 1207 of the detection circuit 1102. If the JTAG bus 904 is not in TAP states 1202, 1204, or 1206, the detection circuit 1102 will be in the idle state 1208. If the JTAG bus 904 is in state 1202, 1204 or 1206, the detection circuit 1102 transitions to state 1210 to enable the detection of a shadow protocol message 1107. If a message start field 1108 occurs in state 1210 the detection circuit 1102 transitions to state 1212 to input an address field 1110 to the address circuit 1104. When the stop field 1112 occurs at the end of an address field input, the detection circuit transitions to state 1214 to evaluate the match signal output from address circuit 1106 to determine if the address input to the address circuit 1104 matches the address of the devices reduced pin DDR interface. The reduced pin DDR interface of each device will have a unique address. If it does not match, the detection circuit sets the ENA signal 1008 low and transitions to state 1210. If it does match, the detection circuit transitions to state 1216 to set the ENA signal 1008 high then transitions to state 1210. When the JTAG bus 904 transitions out of TAP state 1202, 1204 or 1206 to resume JTAG operations, the detection circuit 1102 returns to the idle state 1208.

Following the above described shadow protocol message input 1107, the TAP domain 106 of the selected device 802 can be accessed by the TAP controller 302 via interface bus 501 of FIG. 9. When access to another device 802 TAP domain 106 is desired, the above described process is repeated.

Figure 12D:
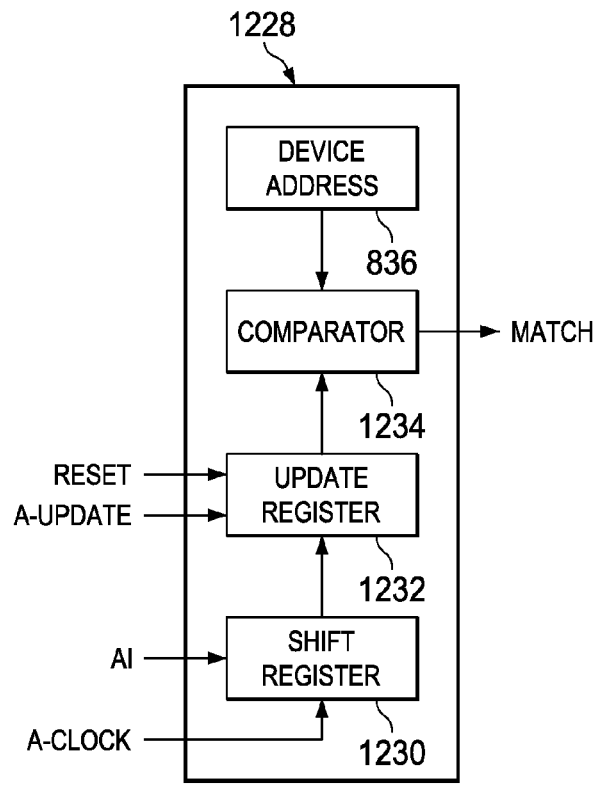
FIG. 12D illustrates an example implementation of the address circuit of FIG. 11.
Figure 12C:
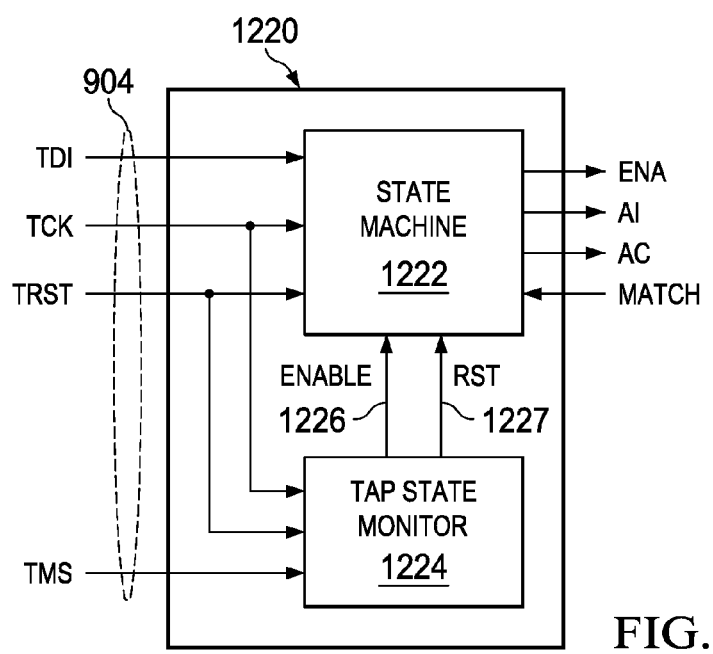
FIG. 12C illustrates an example implementation of the controller of FIG. 12B.

FIG. 12C illustrates an example implementation 1220 of the shadow protocol detection circuit 1102, which consists of a state machine 1222 and a TAP state monitor 1224. The TAP state monitor is basically an IEEE 1149.1 TAP that is used to track the state of the JTAG bus 904. The TAP state monitor 1224 outputs a RST signal 1227 and an Enable signal 1226 to the state machine 1222. The TAP state monitor 1224 outputs a low on RST 1227 whenever the JTAG bus 904 transitions to the Test Logic Reset state of FIG. 12A. The TAP state monitor 1224 outputs a high on the Enable signal 1226 to state machine 1222 whenever the JTAG bus 904 is in the RunTest/Idle state 1202, the Pause-DR state 1204, or the Pause-IR state 1206. If the Enable signal 1226 is low the JTAG bus 904 is not in one of these states and the state machine 1222 will be forced to the idle state 1208 of FIG. 12B. If the enable signal 1226 is high the JTAG bus 904 is in one of these states and the state machine 1222 will transition to state 1210 of FIG. 12B to look for the start field 1108 of a message 1107.

When a message is started, state machine 1222 will transition to state 1212 of FIG. 12B to decode the address symbols (A) input from TDI during address input field 1110 into logic one or zero bits and output these bits on AI to the address circuit 1104. The state machine outputs address control (AC) to the address circuit 1104 to cause the AI bits to be input to the address circuit 1104. In response to detecting the stop field 1112 the state machine 1222 will transition to state 1214 to interpret the Match signal from address circuit 1104 as previously described. If an address match is detected, the state machine transitions to state 1216 to set the ENA signal 1008 high. If an address match does not occur, the state machine sets the ENA signal 1108 low and transitions to state 1210 of FIG. 12B.

In response to a low on TRST of JTAG bus 904, the state machine 1222, TAP state monitor 1224, and address circuit 1104 are reset. Also in response to the RST input 1227 from TAP state monitor 1224 the state machine 1222, and address circuit 1104 are reset.

FIG. 12D illustrates an example implementation 1228 of the address circuit 1104, which comprises a shift register 1230, update register 1232, comparator 1234, and device address 1236. The shift register 1230 receives the address bit input (AI) and an A-Clock input from state machine 1222. The A-clock input is a signal on the AC bus and is used to clock in the address bits from the AI input during state 1212 of FIG. 12B. The update register 1232 inputs the parallel address output from shift register 1230 in response to an A-Update signal from the AC bus. The update register 1232 outputs the updated address to comparator 1234 during state 1214 of FIG. 12B. The comparator compares the address output from the update register to the device address 1236. If the addresses match, the Match signal from the comparator is set high. If the addresses do not match, the Match signal from the comparator is set low.

In response to a reset output from state machine 1222 on the AC bus, as a result of the state machine receiving a low on the TRST or RST input, the update register 1232 is reset to an address value that will not match the device address 1236. Also in response to a TRST or RST input, the state machine sets the ENA signal 1008 low to de-couple JTAG busses 904 and 906 of FIG. 10.

It is common today for devices to contain more that one TAP domain 106. If the device is a board it most likely contains more than one IC each with a Tap domain. If the device is an IC it may include more than one embedded core circuit each with a TAP domain. If the device is a core, it may contain further embedded cores each with a TAP domain. The following description illustrates how the reduced pin DDR interface and circuitry of FIG. 9 is modified to support multiple TAP domains within a device.

Figure 13:
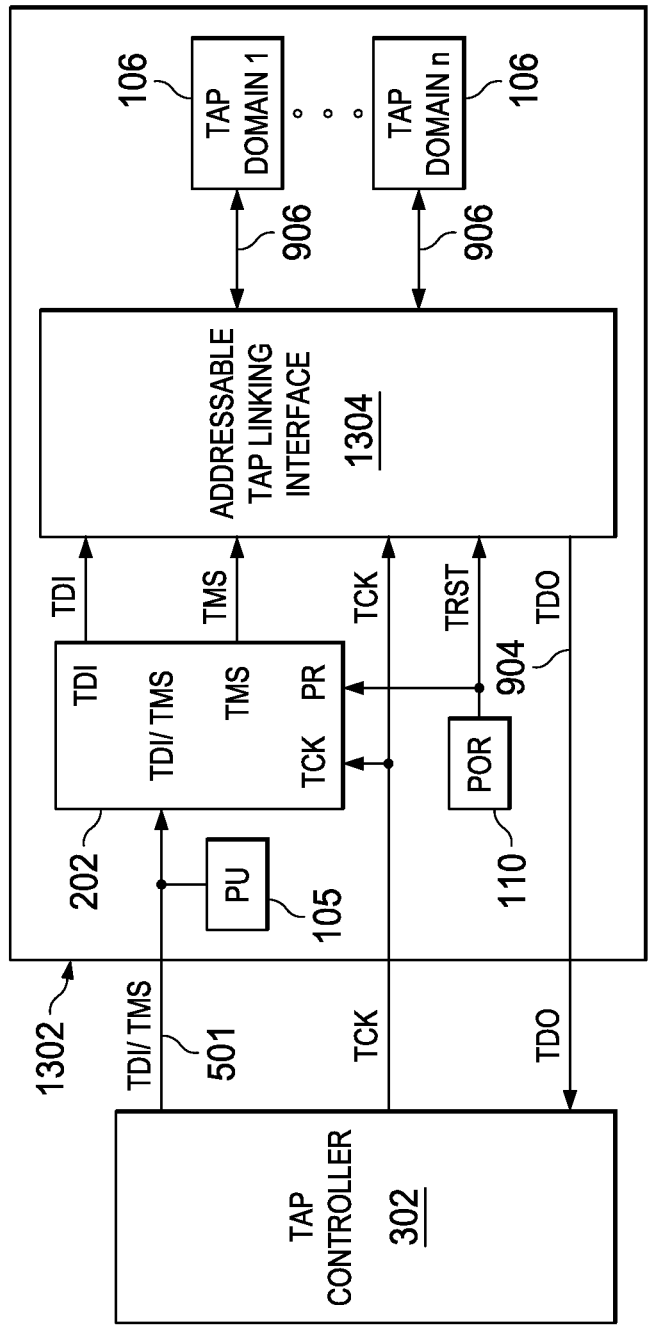
FIG. 13 illustrates the JTAG DDR interface to a device that includes device addressing circuitry and TAP domain linking circuitry according to the disclosure.

FIG. 13 illustrates the reduced pin DDR interface 501 between TAP controller 302 and plural TAP domains 106 of a device 1302. The reduced pin DDR interface circuitry of device 1302 is the same as device 502 of FIGS. 5, 5a, and 6 with the exception that device 1302 includes an addressable TAP linking interface circuit 1304 located between the DDR circuit 202 and plural TAP domains 106. While DDR circuit 202 is shown being used in FIG. 13, DDR circuit 402 could be used as well. Also while TAP domain 106 is shown being used in FIG. 13, TAP domain circuit 508 could be used as well. The addressable TAP linking interface 1304 has a first bus 904 coupled to the TDO signal to TAP controller 302, the TRST signal from POR 110, the TCK signal from TAP controller 302, and the TMS and TDI signals from DDR circuit 202. The addressable TAP linking interface 1304 has plural second busses 906 each second bus being coupled to a particular one of the TAP domains via TDI, TDO, TMS, TCK and TRST signals. The addressable TAP linking interface 1304 operates to selectively couple or de-couple bus 904 to or from one or more buses 906.

Figure 14:
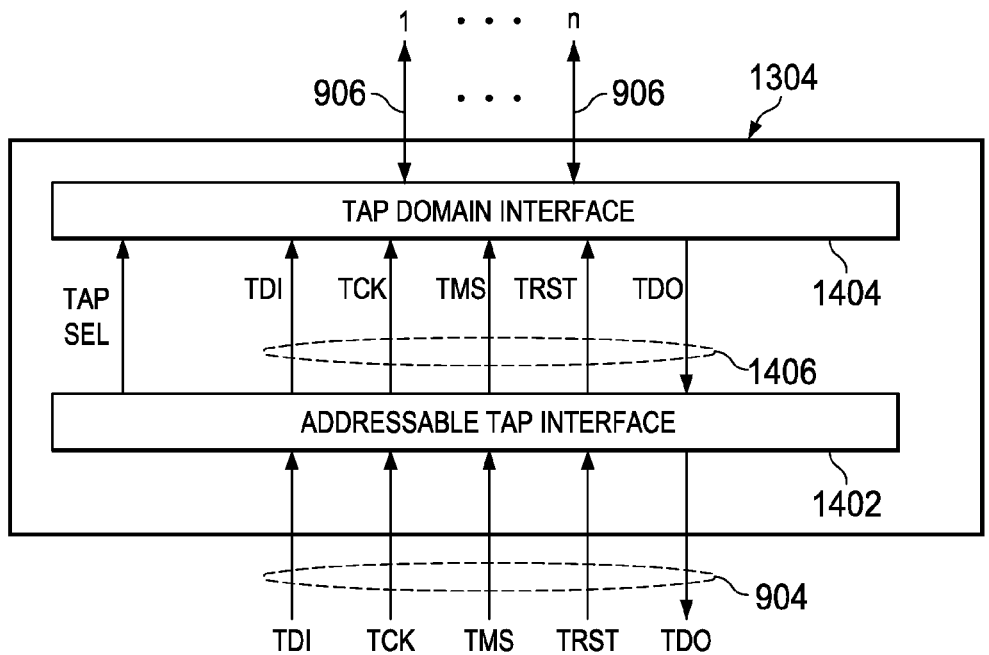
FIG. 14 illustrates the addressing and linking circuitry of FIG. 13 in more detail.

FIG. 14 illustrates the addressable TAP linking interface 1304 of FIG. 13 in more detail, which comprises an addressable TAP interface 1402 and a TAP domain interface 1404. The addressable TAP interface 1402 is coupled to bus 904 and interfaces to the TAP domain interface 1404 via a bus 1406 which comprises TAP select (TAPSEL), TDI, TCK, TMS, TRST, and TDO signals. The TAP domain interface 1404 responds to the TAPSEL signals from bus 1406 to couple the TDI, TCK, TMS, TRST, and TDO signals of bus 1406 to one or more of the TAP domain busses 906.

Figure 15:
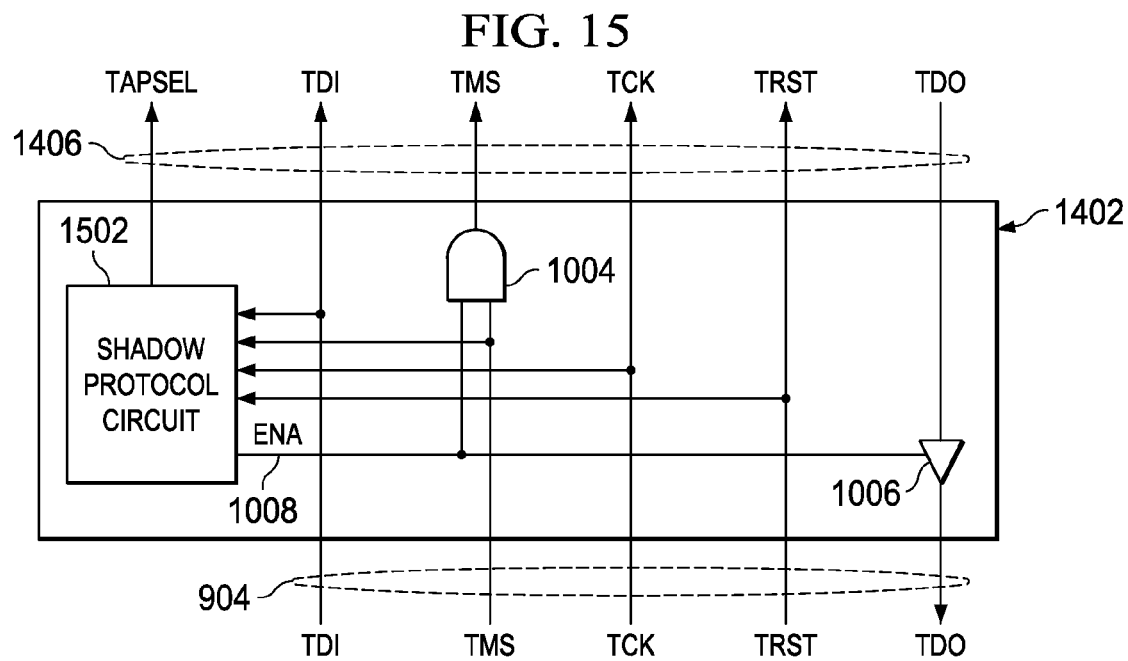
FIG. 15 illustrates an example implementation of the addressing and linking circuit of FIG. 14.

FIG. 15 illustrates the addressable TAP interface 1402 of FIG. 14 which comprises a shadow protocol circuit 1502, And gate 1004, and 3-state buffer 1006. Addressable TAP interface circuit 1402 inputs the TDI, TCK, TMS and TRST signals from bus 904, outputs a TDO signal to bus 904, outputs TAPSEL signals to TAP domain interface 1404, outputs an enable (ENA) signal 1008 to And gate 1004 and TDO 3-state buffer 1006. The TAPSEL output signals control the TAP domain interface 1404 to couple one or more of the TAP domain 106 busses 906 to bus 1406. The ENA output signal 1008 enables And gate 1004 and TDO 3-state buffer 1006, to provide for bus 904 to be fully coupled to one or more of busses 906 via TAP domain interface 1404 and bus 1406. When a bus 906 is fully coupled to bus 904, the TAP domain 106 associated with bus 906 may be accessed by the TAP controller 302 via the reduce pin DDR interface 501.

Figure 16:
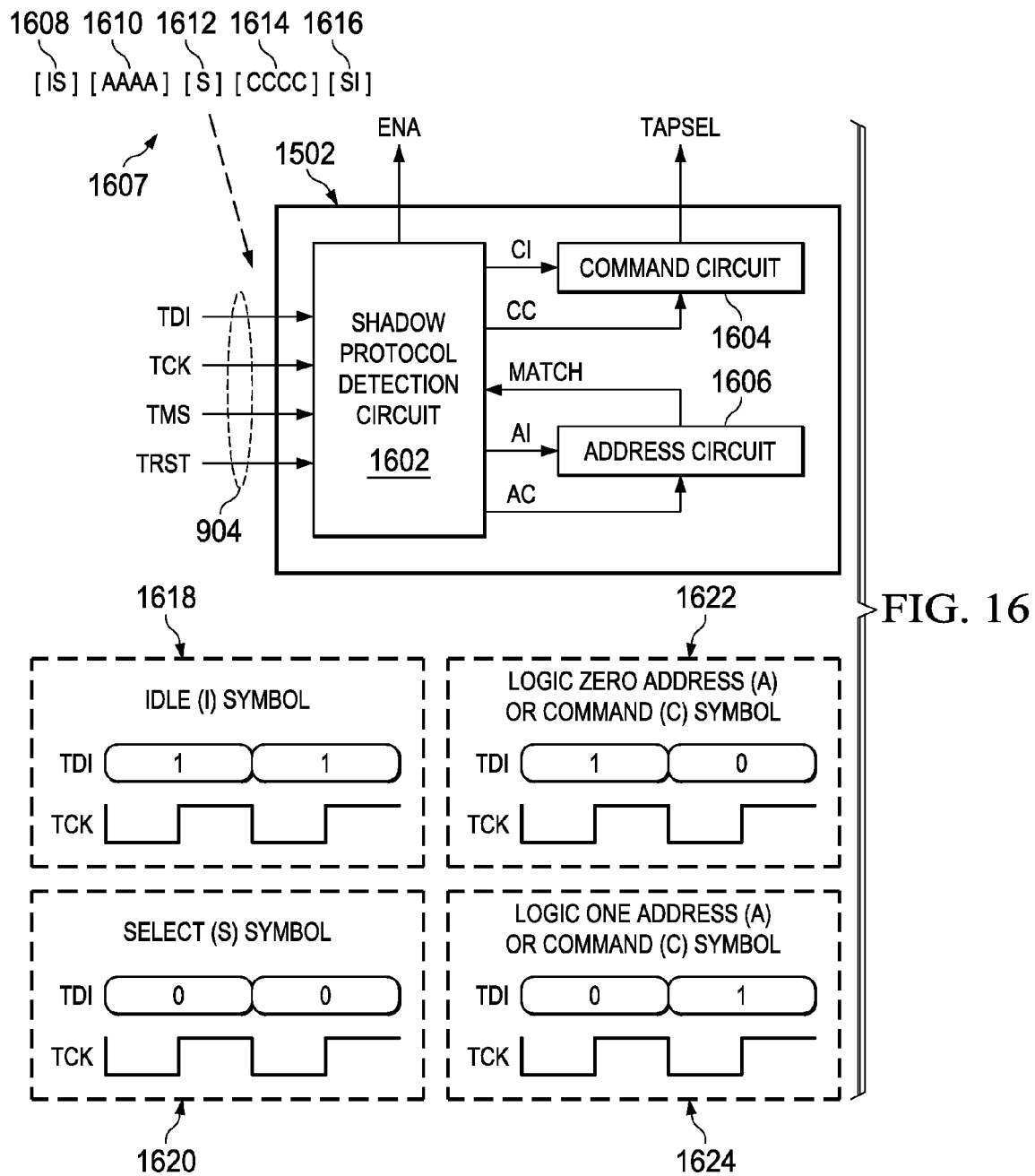
FIG. 16 illustrates an example implementation of the controller, addressing and linking circuit of FIG. 15.

FIG. 16 illustrates the shadow protocol circuit 1502 in more detail, which comprises a shadow protocol detection circuit 1602, command circuit 1604, and address circuit 1606. The shadow protocol detection circuit 1602 inputs the TDI, TCK, TMS and TRST signals from bus 904 and a match signal from address circuit 1606. The detection circuit 1602 outputs a command input (CI) signal and command control signals (CC) to command circuit 1604 and an address input (AI) signal and address control signals (AC) to address circuit 1606. The command circuit 1604 outputs the TAPSEL signal bus to TAP domain interface 1404.

When the JTAG bus 904 is in the RunTest/Idle state 1202, the Pause-DR state 1204, or the Pause-IR state 1206 of the IEEE 1149.1 TAP state diagram 1201 of FIG. 12A, the Detection circuit 1602 is enabled to respond to a shadow protocol message 1607 input on TDI to input address data to the address circuit 1604 and command data to the command circuit 1606. If the JTAG bus 904 is not in one of these states 1202-1206, the detection circuit 1602 is disabled from responding to the message 1607. The detection circuit 1602 and all TAP domains 106 coupled to the TAP domain interface 1404 are reset by the TRST signal going low or by the JTAG bus 904 transitioning to the Test Logic Reset state of FIG. 12A.

The shadow protocol message 1607 consists of a start field 1608 comprising an idle symbol (I) 1618 and a select symbol (S) 1620, an address field 1610 comprising a number of logic one or zero address symbols (A) 1622 and 1624, a delimiter field 1612 comprising a select symbol (S) 1620, a command field 1614 comprising a number of logic one or zero command symbols (C) 1622 and 1624, and a stop field 1616 comprising a select symbol (S) 1620 and an idle symbol (I) 1618. The symbols 1618-1624 are each defined by a pair of logic bits, with the I symbol 1618 being two logic ones, the S symbol 1620 being two logic zeros, the logic zero A or C symbol 1622 being a logic one followed by a logic zero, and the logic one A or C symbol 1624 being a logic zero followed by a logic one. As seen, the TCK times the symbol bit pair inputs on TDI. If desired the symbol bit pair definitions may be defined differently from that shown in examples 1218-1224.

Figure 17:
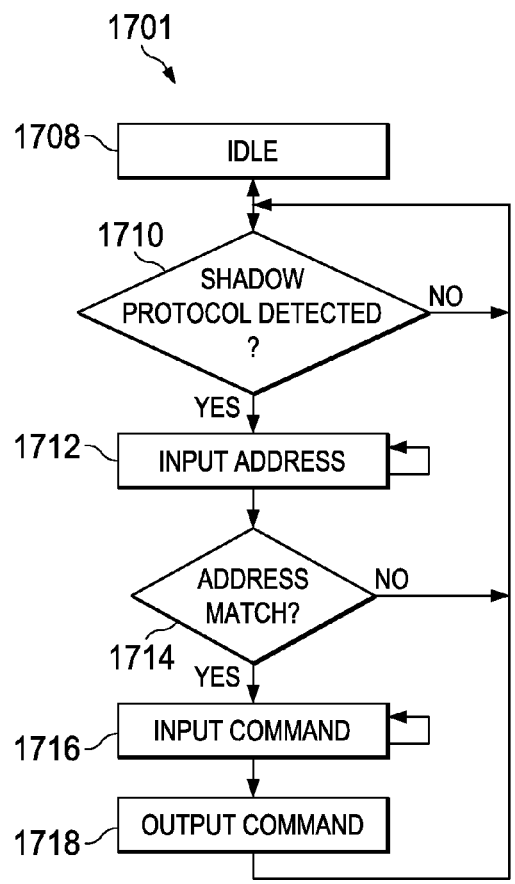
FIG. 17 illustrates the state diagram of the controller of FIG. 16.

FIG. 17 illustrates the state diagram 1701 of the detection circuit 1602. If the JTAG bus 904 is not in TAP states 1202, 1204, or 1206, the detection circuit 1602 will be in the idle state 1708. If the JTAG bus 904 is in state 1202, 1204 or 1206, the detection circuit 1602 transitions to state 1710 to enable the detection of a shadow protocol message 1607. If a message start field 1608 occurs in state 1710 the detection circuit 1602 transitions to state 1712 to input an address field 1610 to the address circuit 1606. When the delimiter field 1612 occurs at the end of an address field input, the detection circuit transitions to state 1714 to evaluate the match signal output from address circuit 1606 to determine if the address input to the address circuit 1606 matches the address of the devices reduced pin DDR interface circuit. If it does not match, the detection circuit sets the ENA signal 1008 low to disable gate 1004 and buffer 1006 and transitions to and remains in state 1710 for the remainder of the message 1607. If it does match, the detection circuit transitions to state 1716 to enable the command circuit 1604 for receiving a command field 1614. When the stop field 1616 occurs at the end of the command field 1614 input, the detection circuit transitions to state 1718 to output the command data on the TAPSEL bus to select one or more TAP domains 106 for access and to set the ENA signal 1008 high to fully couple busses 904 and 1406 of FIG. 15. From state 1718, the detection circuit 1602 transitions to state 1710. When the JTAG bus 904 transitions out of state 1202, 1204 or 1206 to resume JTAG operations, the detection circuit 1602 returns to the idle state 1708.

Following the above described shadow protocol message input 1607, the selected TAP domain(s) 106 can be accessed by the TAP controller 302 via interface bus 501 of FIG. 13. When access to another device TAP domain 106 is desired, the above described process is repeated.

Figure 18A:
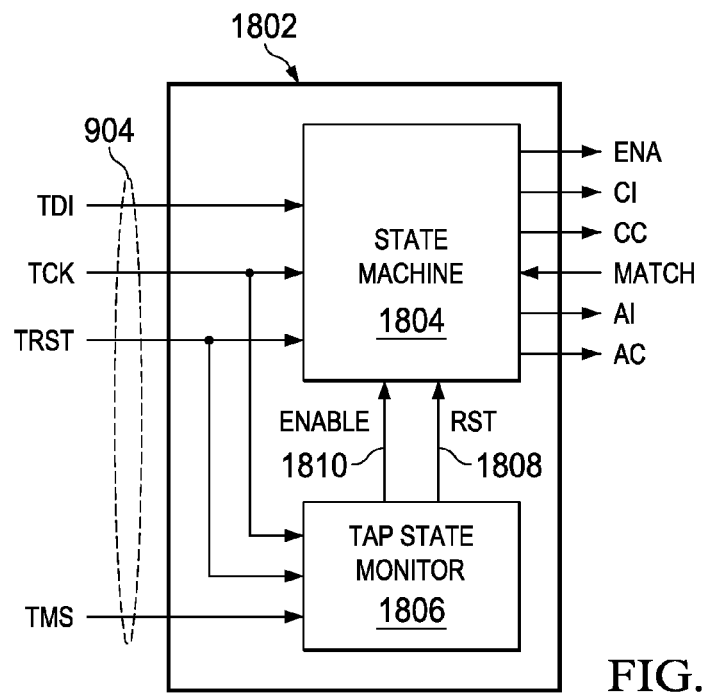
FIG. 18A illustrates an example implementation of the controller of FIG. 16.

FIG. 18A illustrates an example implementation 1802 of the shadow protocol detection circuit 1602, which consists of a state machine 1804 and a TAP state monitor 1806. The TAP state monitor is basically an IEEE 1149.1 TAP that is used to track the state of the JTAG bus 904. The TAP state monitor 1806 outputs a RST signal 1808 and an Enable signal 1810 to the state machine 1804. The TAP state monitor outputs a low on RST 1808 whenever the JTAG bus 904 transitions to the Test Logic Reset state of FIG. 12A. The TAP state monitor outputs a high on the Enable signal 1808 to state machine 1804 whenever the JTAG bus 904 is in the RunTest/Idle state 1202, the Pause-DR state 1204, or the Pause-IR state 1206. If the Enable signal is low the JTAG bus 904 is not in one of these states and the state machine will be forced to the idle state 1708 of FIG. 17. If the enable signal 1810 is high the JTAG bus 904 is in one of these states and the state machine will transition to state 1710 of FIG. 17 to look for the start field 1608 of a message 1607.

When a message is started, state machine 1804 will transition to state 1712 of FIG. 17 to decode the address symbols (A) input from TDI during address input field 1610 into logic one or zero bits and output these bits on AI to the address circuit 1606. The state machine outputs address control (AC) to the address circuit to cause the AI bits to be input to the address circuit. In response to detecting the delimiter field 1612 the state machine 1804 will transition to state 1714 to interpret the Match signal from address circuit 1606 as previously described. If an address match is detected, the state machine transitions to state 1716 to decode the command symbols (C) input from TDI during command input field 1614 into logic one or zero bits and output these bits on CI to the command circuit 1606. If an address match does not occur, state machine 1804 transitions to and remains in state 1710 of FIG. 17. A transition from state 1714 to state 1710, as a result of an address mismatch, sets the ENA signal 1004 output from state machine 1804 low to disable And gate 1004 and TDO 3-state buffer 1006, which fully decouples bus 904 from bus 1406 of FIG. 15.

During command bit outputs to command circuit 1604, the state machine 1804 outputs command control (CC) to the command circuit to cause the command bits to be input to the command circuit. In response to the stop field 1616, the state machine 1804 stops command bit inputs to command circuit 1604, transitions to state 1718 of FIG. 17 to output control on CC to cause the command (TAPSEL bus) to be output from the command circuit 1604. Also in state 1718, the state machine 1804 sets the ENA signal 1008 high to enable And gate 1004 and TDO 3-state buffer 1006 of FIG. 15 to fully couple busses 904 and 1406.

In response to a low on TRST of JTAG bus 904, the state machine 1804, TAP state monitor 1806, address circuit 1606, and command circuit 1604 are reset. Also in response to the RST input 1808 from TAP state monitor 1806 the state machine 1804, address circuit 1606, and command circuit 1604 are reset.

Figure 18B:
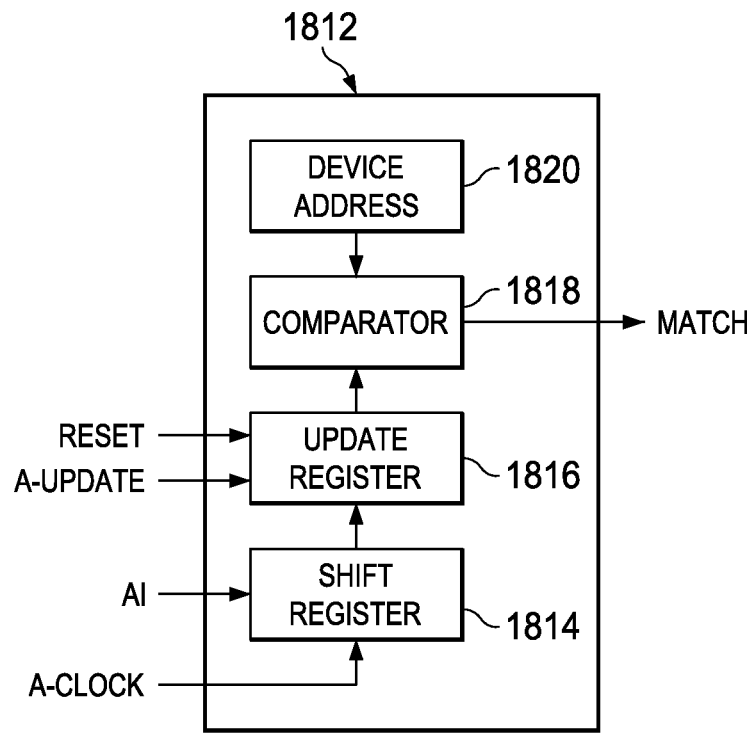
FIG. 18B illustrates an example implementation of the address circuit of FIG. 16.

FIG. 18B illustrates an example implementation 1812 of the address circuit 1606, which comprises a shift register 1814, update register 1816, comparator 1818, and device address 1820. The shift register 1814 receives the address bit input (AI) and an A-Clock input from state machine 1804. The A-clock input is a signal on the AC bus and is used to clock in the address bits from the AI input during state 1712 of FIG. 17. The update register 1816 inputs the parallel address output from shift register 1814 in response to an A-Update signal from the AC bus. The update register 1816 outputs the updated address to comparator 1818 during state 1714 of FIG. 17. The comparator compares the address output from the update register to the device address 1820. The device address 1820 can be a hardwired address or a programmable address, and is unique for each device 1302. If the addresses match, the Match signal from the comparator is set high. If the addresses do not match, the Match signal from the comparator is set low.

In response to a reset output from state machine 1804 on the AC bus, as a result of the state machine receiving a low on the TRST or RST input, the update register 1816 is reset to an address value that will not match the device address 1820.

Figure 18C:
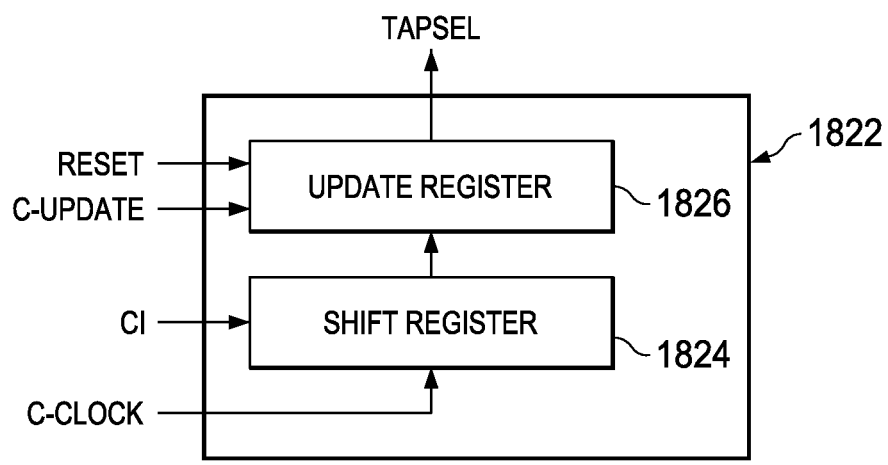
FIG. 18C illustrates an example implementation of the command circuit of FIG. 16.

FIG. 18C illustrates an example implementation 1822 of the command circuit 1604, which comprises a shift register 1824 and an update register 1826. The shift register 1824 receives the command bit inputs (CI) and a C-Clock input from state machine 1804. The C-clock input is a signal on the CC bus and is used to clock in the command bits from the CI input during state 1716 of FIG. 17. The update register 1826 inputs the parallel command output from shift register 1824 in response to a C-Update signal from the CC bus during state 1718 of FIG. 17. The update register 1826 outputs the updated command to the TAPSEL bus.

In response to a reset output from state machine 1804 on the CC bus, as a result of the state machine receiving a low on the TRST or RST input, the update register 1826 is reset to a value where the TAPSEL bus 520 does not select a TAP domain 106 via a bus 906. Also in response to a TRST or RST input, the state machine sets the ENA signal low to fully decouple busses 904 and 1406 of FIG. 15.

Figure 19:
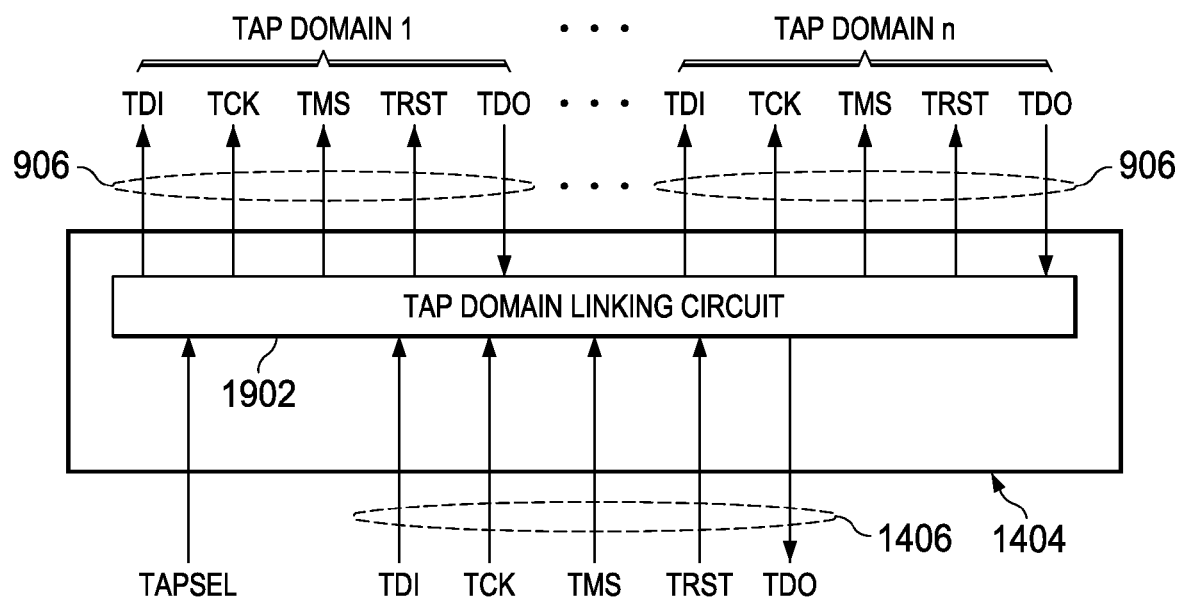
FIG. 19 illustrates an example implementation of the TAP domain interface circuit of FIG. 14.

FIG. 19 illustrates the TAP domain interface 1404 of FIG. 14 in more detail. The TAP domain interface comprises a TAP domain linking circuit 1902. The TAP domain linking circuit 1902 is coupled to bus 1406 from the addressable TAP interface circuit 1402 and to TAP domains 106 via busses 906.

In response to selection input from the TAPSEL bus, and when only one TAP domain 106 is being accessed, the linking circuit 1902 couples the JTAG signals of bus 1406 to a selected bus 906 such that; TDI of bus 1406 drives TDI of selected bus 906, TCK of bus 1406 drives TCK of selected bus 906, TMS of bus 1406 drives TMS of selected bus 906, and TDO of selected bus 906 drives TDO of bus 1406.

In response to a selection input from the TAPSEL bus, and when a first and a second TAP domain 106 are being accessed in a daisy-chain, the linking circuit 1902 couples the JTAG signals of bus 1406 to the selected first and second TAP domains 106, via their busses 906, such that; TDI of bus 1406 drives TDI of the first selected bus 906, TCK of bus 1406 drives TCK of both first and second selected busses 906, TMS of bus 1406 drives TMS of both first and second selected busses 906, TDO of the first selected bus 906 drives TDI of the second select bus 906, and TDO of the second selected bus 906 drives TDO of bus 1406.

The daisy-chaining of more than two TAP domains 106 is achieved by simply inputting control on the TAPSEL bus to select more than two TAP domains 106, which couples TCK and TMS of bus 1406 to all the selected TAP domains via their busses 906, daisy-chains the TDI of bus 1406 to the TDI of the first TAP domain via its bus 906, forms TDO to TDI couplings between each intermediate TAP domain via their busses 906, and finally coupling the TDO of bus 906 of the last selected TAP domain to the TDO of bus 1406.

The reduced pin DDR interface 501 described thus far comprises three signals, TDI/TMS, TCK, and TDO. The following description illustrates how to reduce the number of interface signals down to only two through the use of simultaneously bi-directional transceiver circuitry.

Figure 20:
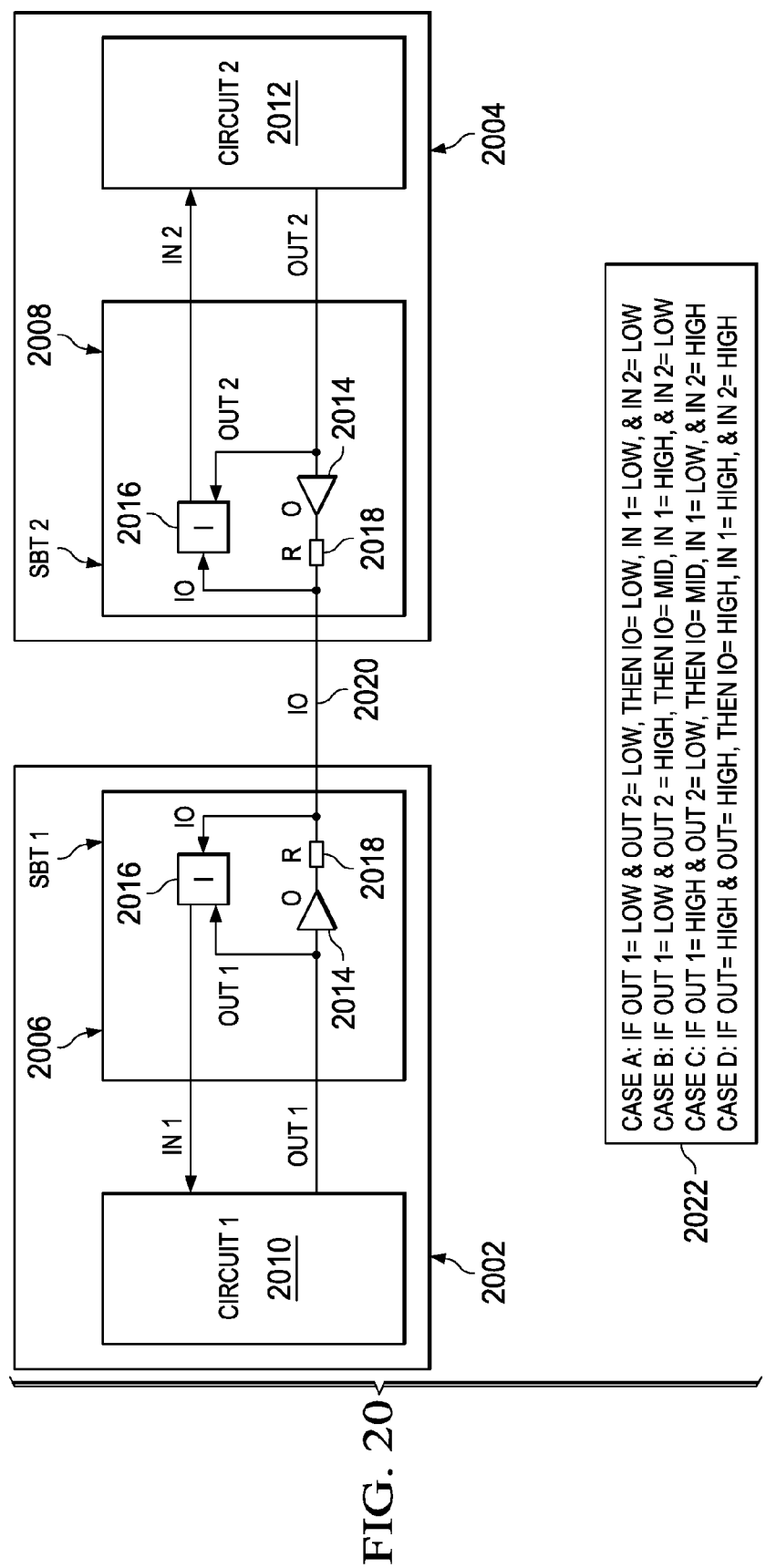
FIG. 20 illustrates a simultaneously bi-directional transceiver (SBT) interface between two circuits.

FIG. 20 illustrates two circuits 2002 and 2004 communicating together using simultaneously bi-directional transceivers (SBT1 and SBT2) 2006 and 2008. SBT circuits are well known in the art of signal communication. SBT1 2006 is coupled to an input (IN1) and an output (OUT1) of a circuit 1 2010 of circuit 2002. SBT2 2008 is coupled to an input (IN2) and an output (OUT2) of a circuit 2 2012 of circuit 2004. SBT circuits consist of an output buffer 2014, an input circuit (I) 2016, and in some cases a register 2018 connected as shown. The output buffer 2018 drives a terminal coupled to I/O signal bus 2020 with the logic level of the OUT1 and OUT2 signals from circuits 2010 and 2012, the input circuit 2016 evaluates the voltage level on the I/O signal bus 2020 and inputs IN1 and IN2 signals to circuits 2010 and 2012, and the resistor, if used, serves to limit the current flow between SBT output buffers 2014 when the output buffers transmit opposite logic levels. SBT circuits operate by communicating one of three logic levels on the I/O signal bus 2020, a high voltage, a middle voltage, and a low voltage.

Figure 21:
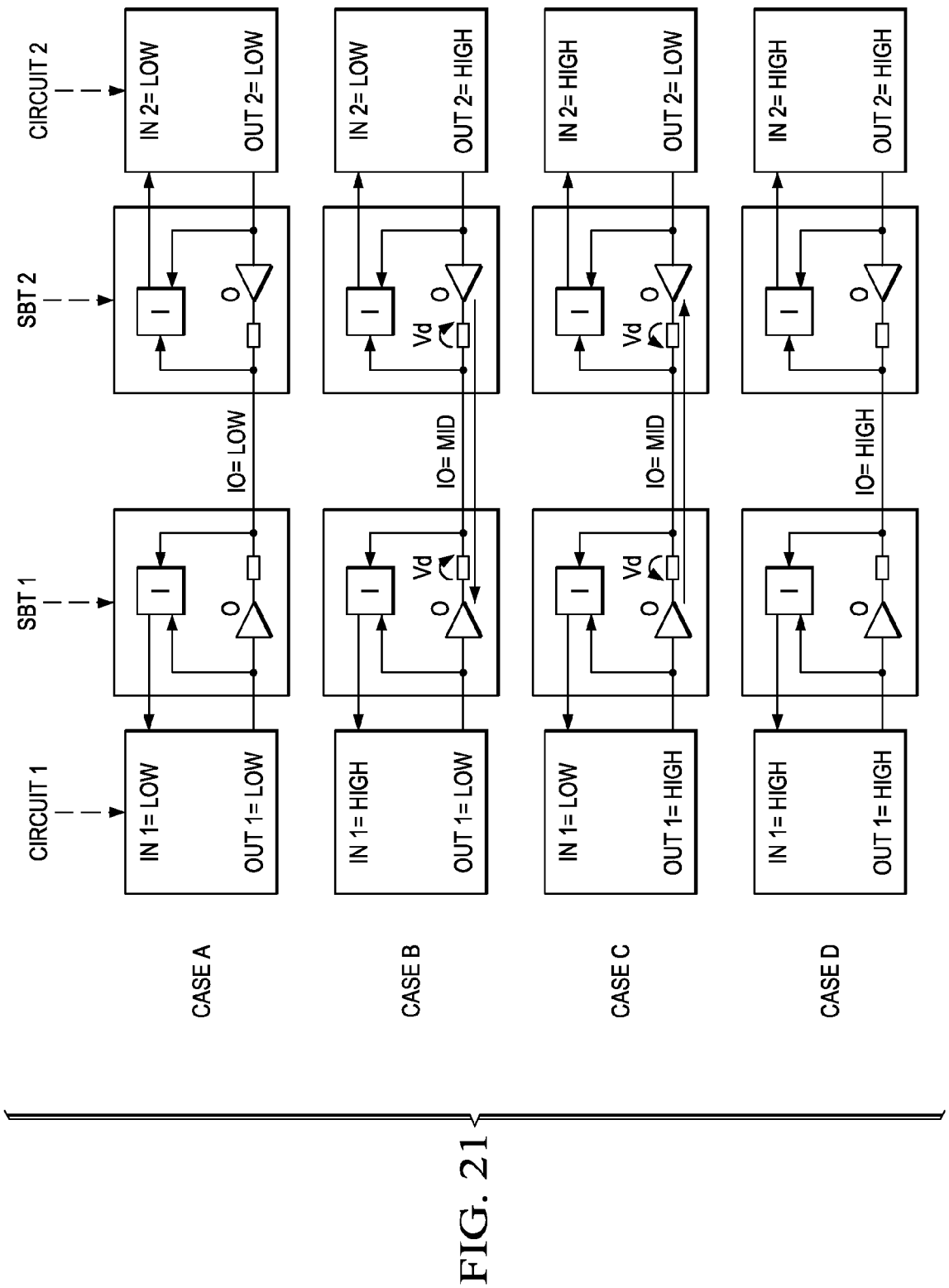
FIG. 21 illustrates the four operational cases of SBT circuit communication.

The functional operation of the SBT circuits of FIG. 20 is best described by the case statements A-D 2022 shown in FIG. 20 and operationally illustrated in FIG. 21. As can be seen for each case A-D, the OUT1 and OUT2 signal outputs of circuits 2010 and 2012 are simultaneously input to the IN2 and IN1 signal inputs of circuits 2010 and 2012, respectively via the I/O signal bus 2020. A more detailed description of the operation of the example SBT circuits of FIGS. 20 and 21 is provided in the 2006 IEEE ITC Whetsel paper referenced in the background section of this disclosure.

Figure 22:
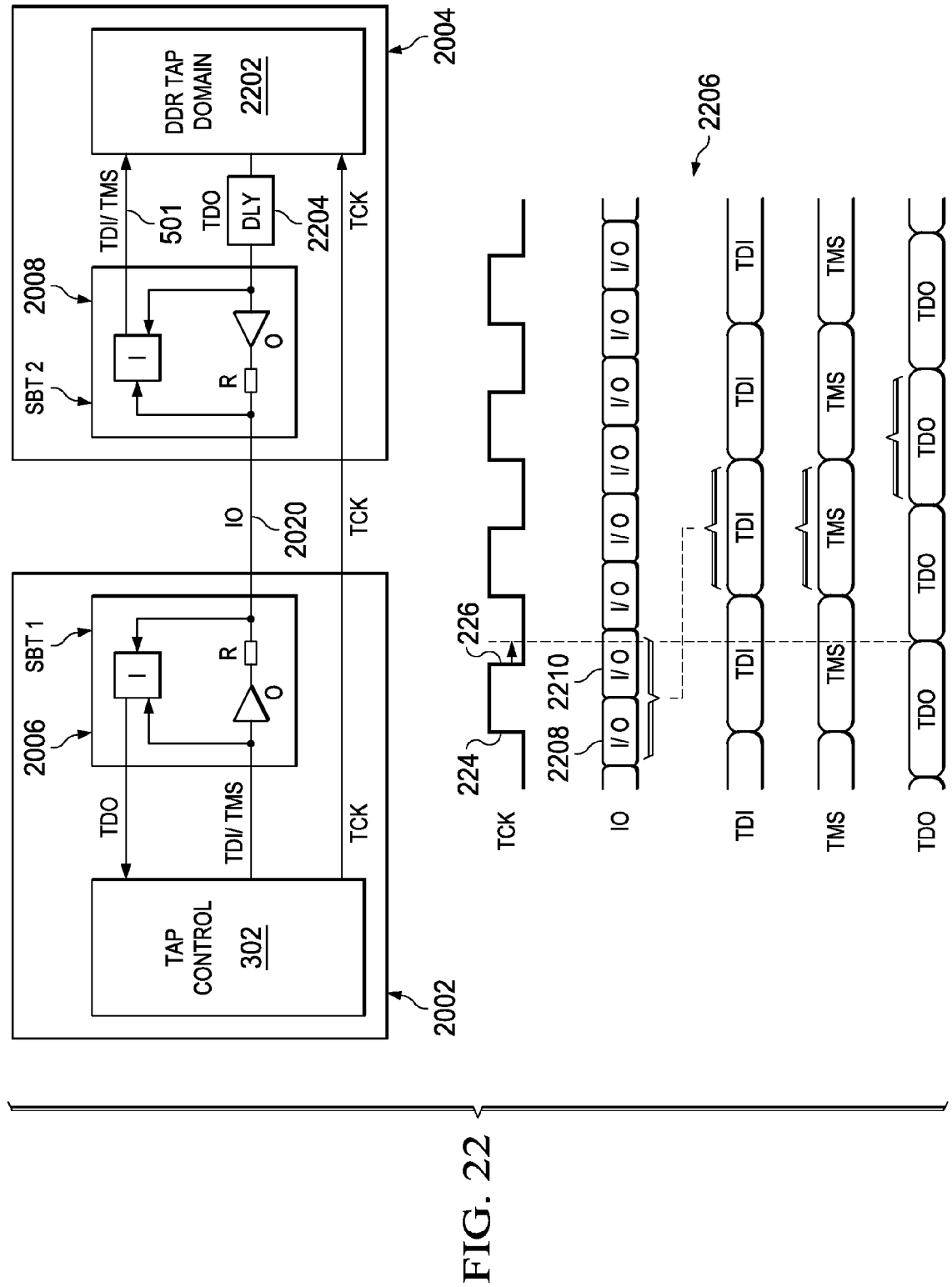
FIG. 22 illustrates a first example of using SBT circuit communication between a DDR TAP controller and DDR TAP domain within a device according to the disclosure.

FIG. 22 illustrates the FIG. 20 example whereby the circuit 1 2010 of circuit 2002 is replaced by TAP controller 302 and circuit 2012 of circuit 2004 is replaced by a DDR TAP domain 2202 with a three signal interface 501. The DDR TAP domain 2202 could be the DDR TAP domain of the devices 502 of FIG. 5, 5A, or 6, which comprise a DDR circuit 202 or 402, a TAP domain circuit 106 or 508, and a POR circuit 110. The PU circuit 105 of FIGS. 5, 5A, and 6 is not required since that function is provided by circuitry within the SBT 2008. TAP controller 302 and DDR TAP domain 2202 operate as previously described in FIGS. 5, 5A, and 6, with the exception that SBT circuits 2006 and 2008 are used to "simultaneously" communicate the TDO signal from the DDR TAP domain 2202 to the TAP controller 302 and the TDI/TMS signal from the TAP controller 302 to the DDR TAP domain 2202 via I/O signal bus 2020.

Figure 22A:
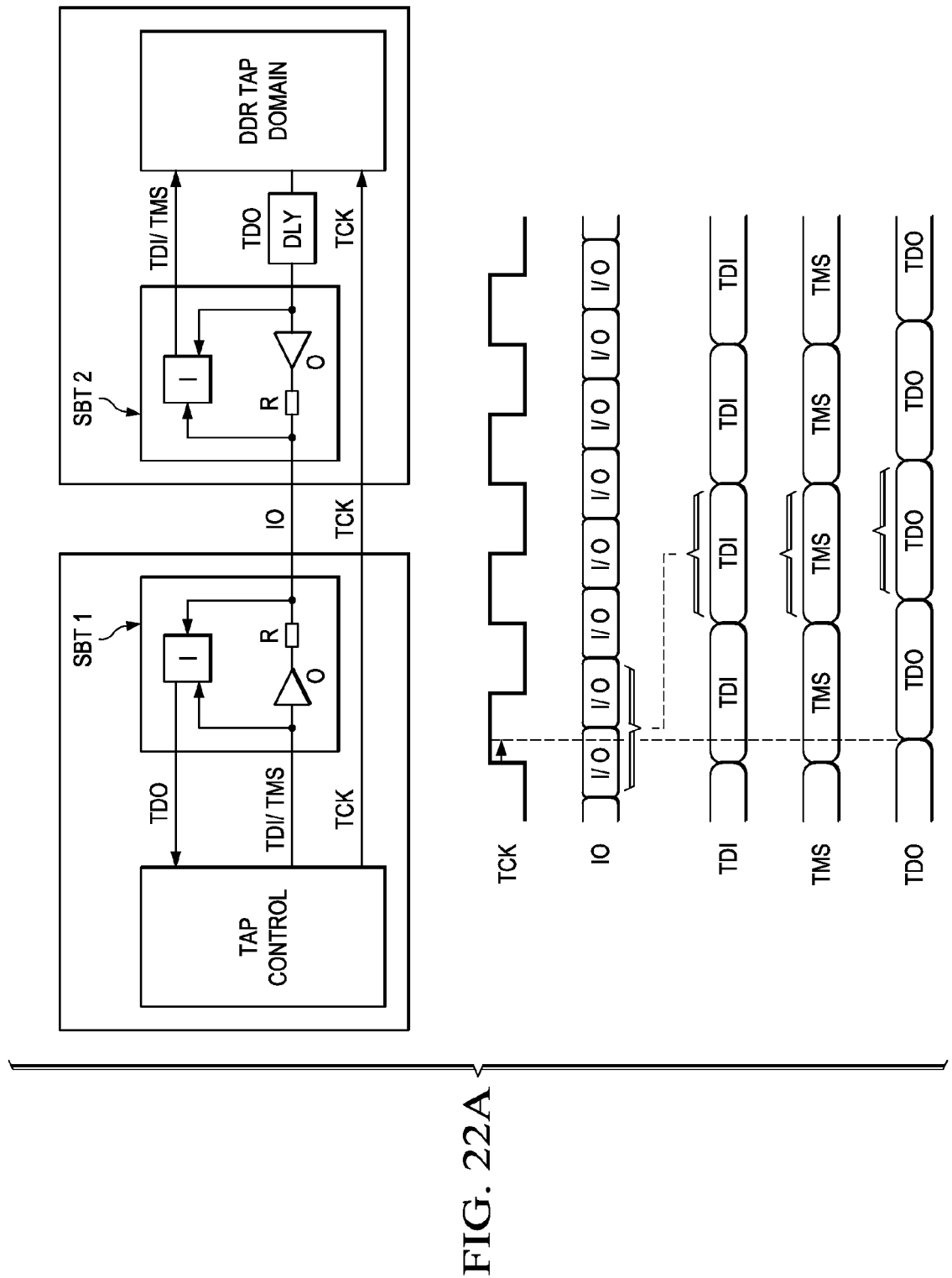
FIG. 22A illustrates a second example of using SBT circuit communication between a DDR TAP controller and DDR TAP domain within a device according to the disclosure.
Figure 22B:
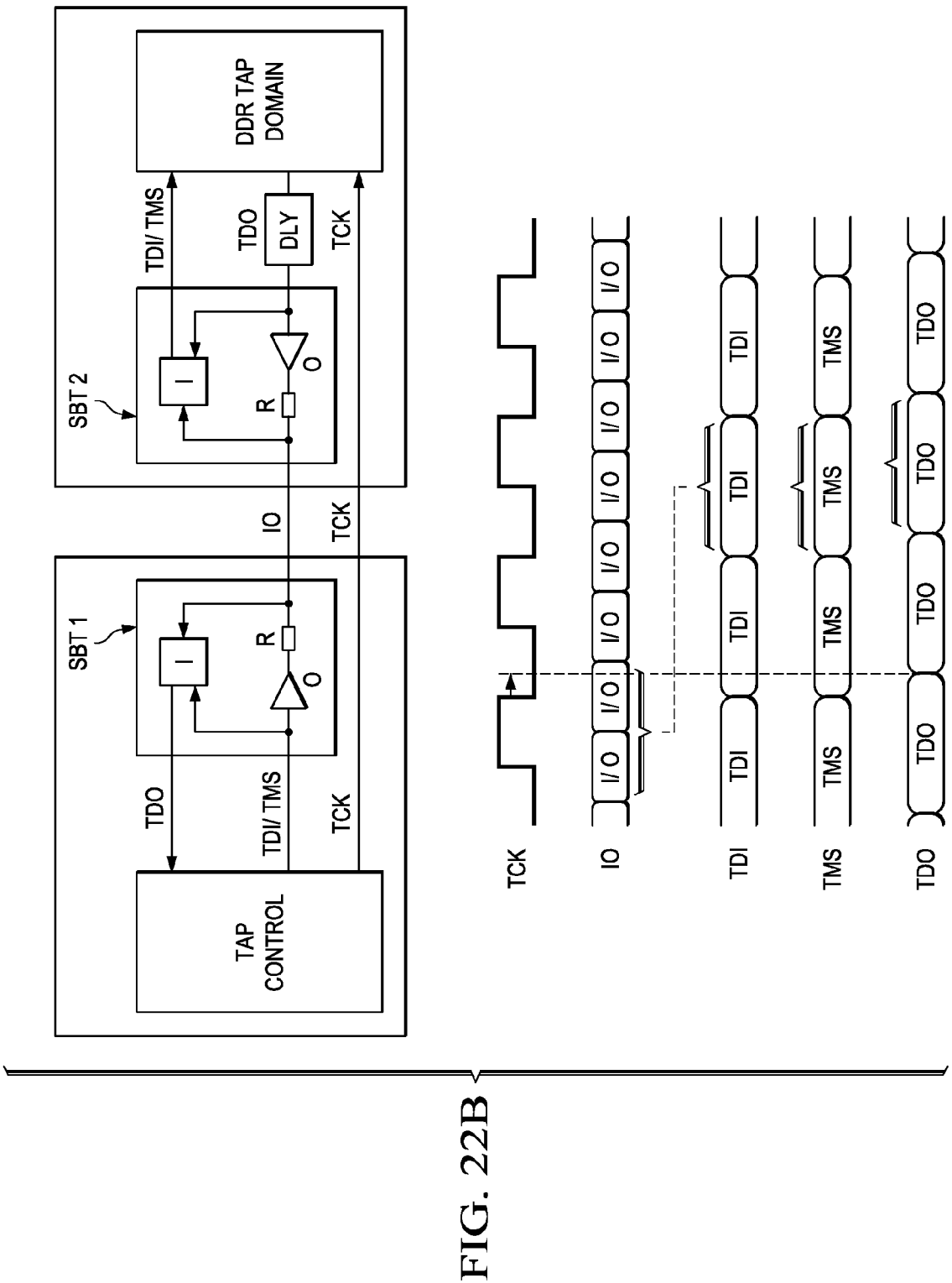
FIG. 22B illustrates a third example of using SBT circuit communication between a DDR TAP controller and DDR TAP domain within a device according to the disclosure.

The operation of the SBT based DDR interface of FIG. 22 is illustrated in timing diagram 2206. The I/O signal bus 2020 simultaneously inputs the TDI component of TDI/TMS from TAP controller 302 and outputs the TDO signal from DDR TAP domain 2202, via SBT 2006 and 2008, during I/O times 2208. The I/O signal bus 2020 simultaneously inputs the TMS component of TDI/TMS from TAP controller 302 and outputs the TDO signal from DDR TAP domain 2202, via SBT 2006 and 2008, during I/O times 2210. As seen, a delay circuit 2204 has been inserted into the TDO signal path from the DDR TAP domain 2202 and SBT circuit 2008. This delay circuit is used to move the falling edge TDO output signal from DDR TAP domain 2202 away from the falling edge 226 of the TCK signal from TAP controller 302. This eliminates the TDO output transition from DDR TAP domain 2202 from interfering with the falling edge 226 sampling (clocking) of the TMS component into the DDR circuit 202 of DDR TAP domain 2202 during I/O times 2210. With the exception that the TDI/TMS and TDO signals are bi-directionally transmitted on I/O bus 2020 using SBT circuits 2006 and 2008, the timing operation of the TAP controller 302 and DDR TAP domain 2202 are the same as the timing diagram 506 of FIG. 5. While timing example 2206 illustrates how the timing diagram 506 of FIG. 5 operates when SBT circuits 2006 and 2008 are used, the timing diagrams of FIGS. 5A and 6 could operate equally well when SBT circuits 2006 and 2008 are used as illustrated in FIGS. 22A and 22B, respectively.

Figure 23:
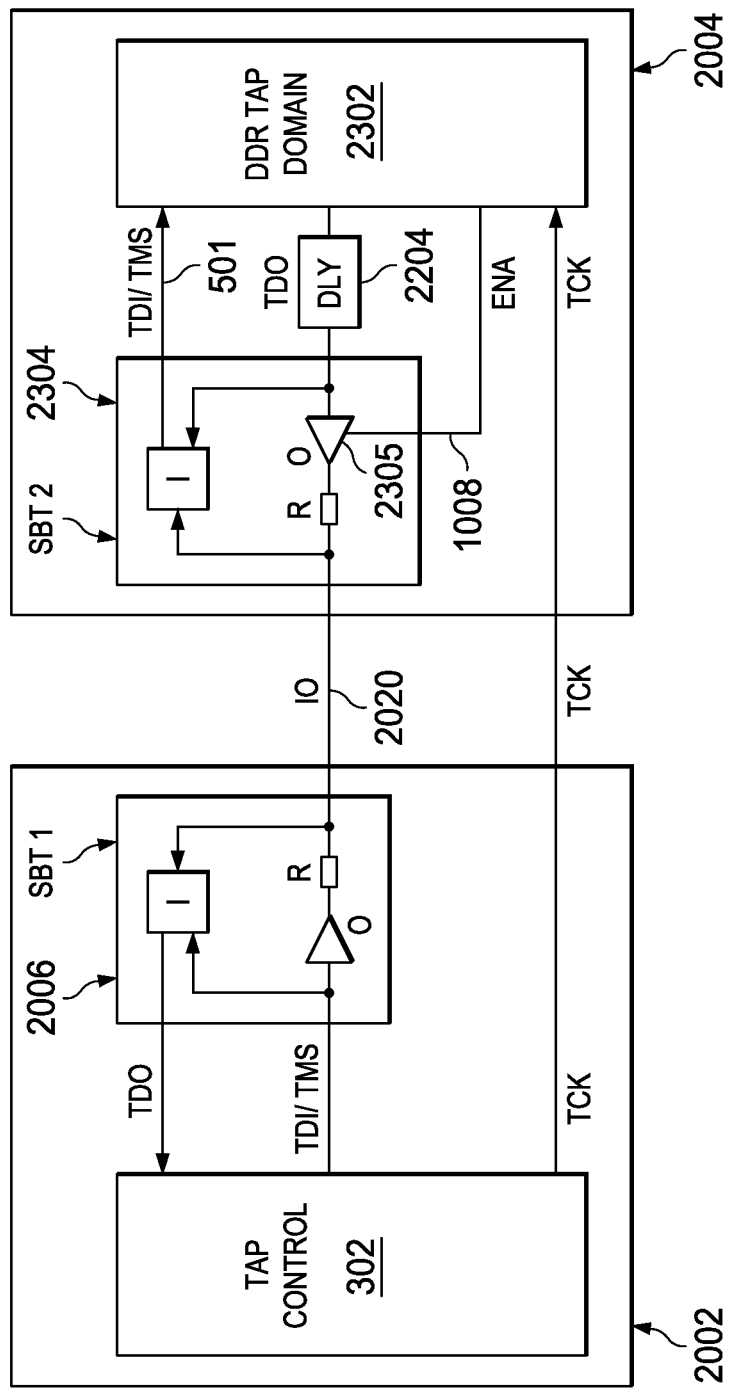
FIG. 23 illustrates an example of using SBT circuit communication between a DDR TAP controller and an addressable DDR TAP domain within a device according to the disclosure.

FIG. 23 illustrates the FIG. 20 example whereby the circuit 1 2010 of circuit 2002 is replaced by TAP controller 302 and circuit 2012 of circuit 2004 is replaced by a DDR TAP domain 2302 with a three signal interface 501. The DDR TAP domain 2302 could be the DDR addressable TAP domain of device 802 of FIG. 9 which comprises a DDR circuit 202, addressable TAP interface circuit 902 TAP domain 106, and POR 110 The DDR TAP domain 2302 could also be the DDR addressable TAP linking domain of device 1302 of FIG. 13 which comprise a DDR circuit 202, addressable TAP linking circuit 1304, plural TAP domain circuits 106, and a POR circuit 110. TAP controller 302 and DDR TAP domain 2302 operate as previously described in FIGS. 9 and 13 with the exception that SBT circuits 2006 and 2304 are used to "simultaneously" communicate the TDO signal from the DDR TAP domain 2302 to the TAP controller 302 and the TDI/TMS signal from the TAP controller 302 to the DDR TAP domain 2302 via I/O signal bus 2020.

As seen, the output buffer 2014 of SBT circuit 2304 has been changed to a 3-state output buffer 2305 and the ENA signal 1008 from shadow protocol circuit 1008 of FIG. 10 or from shadow protocol circuit 1502 of FIG. 15 of the DDR TAP domain 2302 is output to control the 3-state output buffer 2305. Also, circuits 902 and 1402 have been modified to remove the 3-state buffer 1006 from the TDO signal path. 3-state buffer 2305 serves the purpose previously provided by the 3-state buffer 1006 of circuits 902 and 1402, that being to provide for TDO from DDR TAP domain 2302 to drive the I/O bus 2020 to the TAP controller 302 when device 2004 is addressed. This provide fors the SBT interface of FIG. 23 to operate in the addressable device arrangement of FIG. 8, i.e. when a device 2004 is addressed, the 3-state output buffer 2305 of that device's SBT 2304 is enabled to communicate TDO data to the TAP controller 302 via the I/O bus 2020. When addressed a device's DDR TAP interface 2302 communicates with the TAP controller 302 via the SBT circuits 2006 and 2304 as shown in the timing diagrams of FIGS. 22, 22A, and 22B.

Although the disclosure has been described in detail, it should be understood that various changes, substitutions and alterations may be made without departing from the spirit and scope of the disclosure as defined by the appended claims.

What is claimed is:

1. An integrated circuit comprising:
   A. a TDI/TMS input lead;
   B. a TCK input lead;
   C. a TDO output lead;
   D. double data rate circuitry having an input coupled to the TDI/TMS input lead, an input coupled to the TCK input lead, and separate TDI and TMS output leads;
   E. addressable TAP interface circuitry having:
      i. a TDI input coupled to the TDI output lead;
      ii. a TMS input coupled to the TMS output lead;
      iii. a TCK input coupled to the TCK input lead;
      iv. a TDO output coupled to the TDO output lead;
      v. a TDI output coupled to the TDI input;
      vi. a TMS output coupled to the TMS input;
      vii. a TCK output coupled to the TCK input;
      viii. a TDO input coupled to the TDO output;
      ix. shadow protocol circuitry having inputs coupled to the TDI input, the TMS input, and the TDK input, and having an enable output;
      x. a first logic gate having inputs coupled to the TMS input and the enable output and having an output coupled to the TMS output; and
      xi. a second logic gate having an input coupled to the TDO input, an enable input coupled to the enable output, and an output coupled to the TDO output; and
   F. a TAP domain having:
      i. a TDI input coupled to the TDI output of the addressable TAP interface circuitry;
      ii. a TMS input coupled to the TMS output of the addressable TAP interface circuitry;
      iii. a TCK input coupled to the TCK output of the addressable TAP interface circuitry;
      iv. a TDO output coupled to the TDO input of the addressable TAP interface circuitry.

2. The integrated circuit of claim 1 in which the first logic gate is an AND gate.

3. The integrated circuit of claim 1 in which the second logic gate is a tri-state buffer.

* * * * *